(12) United States Patent
Chih et al.

(10) Patent No.: US 11,532,868 B2
(45) Date of Patent: Dec. 20, 2022

(54) ANTENNA APPARATUS AND METHOD

(71) Applicant: Taiwan Semiconductor Manufacturing Company, Ltd., Hsinchu (TW)

(72) Inventors: Lai Wei Chih, Hsinchu (TW); Monsen Liu, Zhudong Township (TW); En-Hsiang Yeh, Hsinchu (TW); Chuei-Tang Wang, Taichung (TW); Chen-Hua Yu, Hsinchu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 362 days.

(21) Appl. No.: 16/826,538

(22) Filed: Mar. 23, 2020

(65) Prior Publication Data
US 2020/0220250 A1 Jul. 9, 2020

Related U.S. Application Data

(63) Continuation of application No. 15/958,468, filed on Apr. 20, 2018, now Pat. No. 10,622,701, which is a
(Continued)

(51) Int. Cl.
*H01L 23/31* (2006.01)
*H01Q 1/22* (2006.01)
(Continued)

(52) U.S. Cl.
CPC ......... *H01Q 1/2283* (2013.01); *H01L 21/486* (2013.01); *H01L 21/56* (2013.01);
(Continued)

(58) Field of Classification Search
CPC ......... H01L 23/3121; H01L 2223/6677; H01L 2224/02379; H01L 2224/04105;
(Continued)

(56) References Cited

U.S. PATENT DOCUMENTS 5,736,456 A 4/1998 Akram
6,277,761 B1 8/2001 Diewald et al.
(Continued)

FOREIGN PATENT DOCUMENTS

CN 101207101 A 6/2008
DE 102007061563 A1 8/2008
(Continued)

OTHER PUBLICATIONS

Mulder and Dillon, Through Silicon Via (TSV) Technology Status, Jun. 12, 2012, pp. 1-19.
(Continued)

*Primary Examiner* — Trang Q Tran
(74) *Attorney, Agent, or Firm* — Slater Matsil, LLP

(57) ABSTRACT

An antenna apparatus comprises a semiconductor die in a molding compound layer, a first through via is between a sidewall of the semiconductor die and a sidewall of the molding compound layer and an antenna structure over the molding compound layer, wherein a first portion of the antenna structure is directly over a top surface of the semiconductor die and a second portion of the antenna structure is directly over a top surface of the first through via.

20 Claims, 42 Drawing Sheets

Related U.S. Application Data continuation of application No. 15/237,904, filed on Aug. 16, 2016, now Pat. No. 9,985,336, which is a continuation of application No. 13/714,087, filed on Dec. 13, 2012, now Pat. No. 9,431,369.

(51) Int. Cl.

| | | |
|---|---|---|
| *H01L 23/00* | (2006.01) | |
| *H01L 23/66* | (2006.01) | |
| *H01L 21/48* | (2006.01) | |
| *H01L 21/56* | (2006.01) | |
| *H01L 23/48* | (2006.01) | |
| *H01L 23/498* | (2006.01) | |
| *H01L 23/522* | (2006.01) | |
| *H01Q 1/36* | (2006.01) | |
| *H01Q 9/04* | (2006.01) | |

(52) U.S. Cl.
CPC ...... *H01L 23/481* (2013.01); *H01L 23/49827* (2013.01); *H01L 23/5226* (2013.01); *H01L 23/66* (2013.01); *H01L 24/02* (2013.01); *H01L 24/19* (2013.01); *H01L 24/96* (2013.01); *H01Q 1/36* (2013.01); *H01Q 9/0407* (2013.01); *H01L 21/568* (2013.01); *H01L 23/3121* (2013.01); *H01L 2223/6677* (2013.01); *H01L 2224/02379* (2013.01); *H01L 2224/04105* (2013.01); *H01L 2224/12105* (2013.01); *H01L 2224/73267* (2013.01); *H01L 2924/15311* (2013.01); *H01L 2924/181* (2013.01)

(58) Field of Classification Search
CPC . H01L 2224/12105; H01L 2224/73267; H01L 2924/15311; H01L 2924/181
See application file for complete search history.

(56) References Cited

U.S. PATENT DOCUMENTS

| | | |
|---|---|---|
| 6,800,941 B2 | 10/2004 | Lee et al. |
| 7,319,065 B1 | 1/2008 | Yu et al. |
| 7,667,318 B2 | 2/2010 | Yang et al. |
| 8,278,749 B2 | 10/2012 | Lachner et al. |
| 8,471,376 B1 | 6/2013 | Liou et al. |
| 8,669,622 B2 | 3/2014 | Lee et al. |
| 8,669,655 B2 | 3/2014 | Geitner et al. |
| 8,786,081 B2 | 7/2014 | Chen |
| 8,844,826 B2 | 9/2014 | Rogy et al. |
| 8,884,765 B2 | 11/2014 | MacKenzie et al. |
| 9,640,580 B2 | 5/2017 | Lee et al. |
| 2002/0086519 A1 | 7/2002 | Houston et al. |
| 2006/0049995 A1 | 3/2006 | Imaoka et al. |
| 2008/0142941 A1 | 6/2008 | Yew et al. |
| 2009/0086519 A1 | 4/2009 | Sadakata et al. |
| 2009/0155956 A1 | 6/2009 | Pohl et al. |
| 2011/0037169 A1 | 2/2011 | Pagaila |
| 2011/0079917 A1 | 4/2011 | Xia et al. |
| 2012/0062439 A1 | 3/2012 | Liao et al. |
| 2012/0228754 A1 | 9/2012 | Liu et al. |
| 2013/0292808 A1* | 11/2013 | Yen ................ H01L 21/561 257/E23.114 |
| 2014/0208279 A1 | 7/2014 | Bhawmik |
| 2014/0293529 A1 | 10/2014 | Nair et al. |
| 2015/0048520 A1 | 2/2015 | Skinner et al. |
| 2018/0366347 A1 | 12/2018 | Chuang et al. |

FOREIGN PATENT DOCUMENTS

| | | |
|---|---|---|
| DE | 102010001407 A1 | 9/2010 |
| JP | 2006101494 A | 4/2006 |

OTHER PUBLICATIONS

Wojnowski, M., et al., "A 77-GHz SiGe Single-Chip Four-Channel Transceiver Module with Integrated Antennas in Embedded Wafer-Level BGA Package," Electronics Components and Technology Conference (ECTC), May 29, 2012-Jun. 1, 2012, pp. 1027-1032.

\* cited by examiner

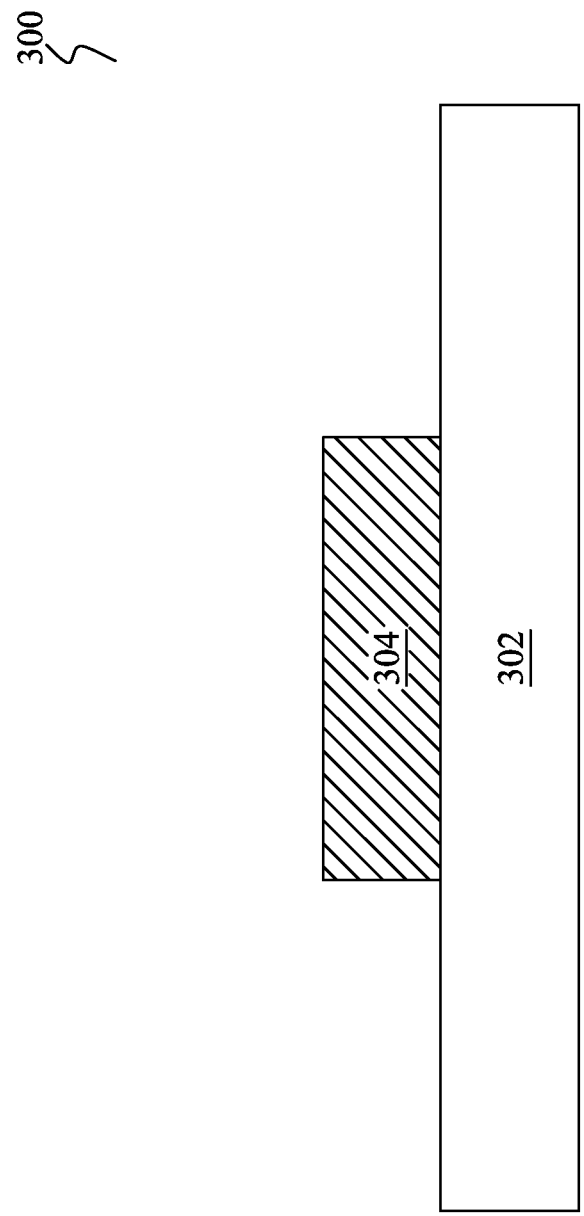

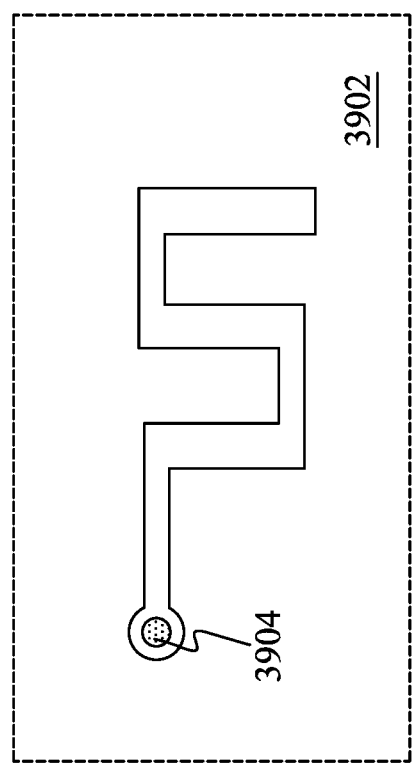

ANTENNA APPARATUS AND METHOD

This application is a continuation of U.S. patent application Ser. No. 15/958,468, entitled "Antenna Apparatus and Method," filed Apr. 20, 2018 and issued as U.S. Pat. No. 10,622,701 on Apr. 14, 2020, which is a continuation of U.S. patent application Ser. No. 15/237,904, entitled "Antenna Apparatus and Method," filed Aug. 16, 2016 and issued as U.S. Pat. No. 9,985,336 on May 29, 2018, which is a continuation of U.S. patent application Ser. No. 13/714,087, entitled "Antenna Apparatus and Method," filed Dec. 13, 2012 and issued as U.S. Pat. No. 9,431,369 on Aug. 30, 2016, each application is incorporated herein by reference.

BACKGROUND

Since the invention of the integrated circuit, the semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer level package based semiconductor devices have emerged as an effective alternative to further reduce the physical size of a semiconductor chip. There may be two signal routing mechanisms in a wafer level package based semiconductor device, namely a fan-in signal routing mechanism and a fan-out signal routing mechanism. In a semiconductor device having a fan-in signal routing mechanism, input and output pads of each die are limited to an area within the footprint of the semiconductor die. With the limited area of the die, the number of the input and output pads is limited due to the limitation of the pitch of the input and output pads.

In a semiconductor device having a fan-out signal routing mechanism, the input and output pads of a die can be redistributed to an area outside the area of the die. As such, the input and output pads can spread signals to a larger area than the area of the die and provide additional space for interconnects. As a result, the number of input and output pads of the semiconductor device can be increased.

In a fan-out structure, the signal redistribution can be implemented by using a redistribution layer. The redistribution layer may couple an input and output pad within the area of the die and another input and output pad outside the area of the die so that signals from the semiconductor die can be spread outside the footprint of the semiconductor die.

A molding compound layer may be formed over the semiconductor die. The molding compound layer may be formed of epoxy based resins and the like. A portion of the molding compound layer located from the edge of the die to the edge of the semiconductor device is commonly referred to as a fan-out area of the semiconductor device.

BRIEF DESCRIPTION OF THE DRAWINGS

For a more complete understanding of the present embodiments, reference is now made to the following descriptions taken in conjunction with the accompanying drawings, in which:

FIG. 3B illustrates a cross sectional view a semiconductor device in accordance with another embodiment;

FIG. 38 illustrates a top view of an antenna structure in accordance with an embodiment;

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present disclosure will be described with respect to embodiments in a specific context, namely a semiconductor device having an antenna structure formed by post passivation interconnects. The embodiments of the disclosure may also be applied, however, to a variety of antenna structures and semiconductor devices. Hereinafter, various embodiments will be explained in detail with reference to the accompanying drawings.

Figure 1:
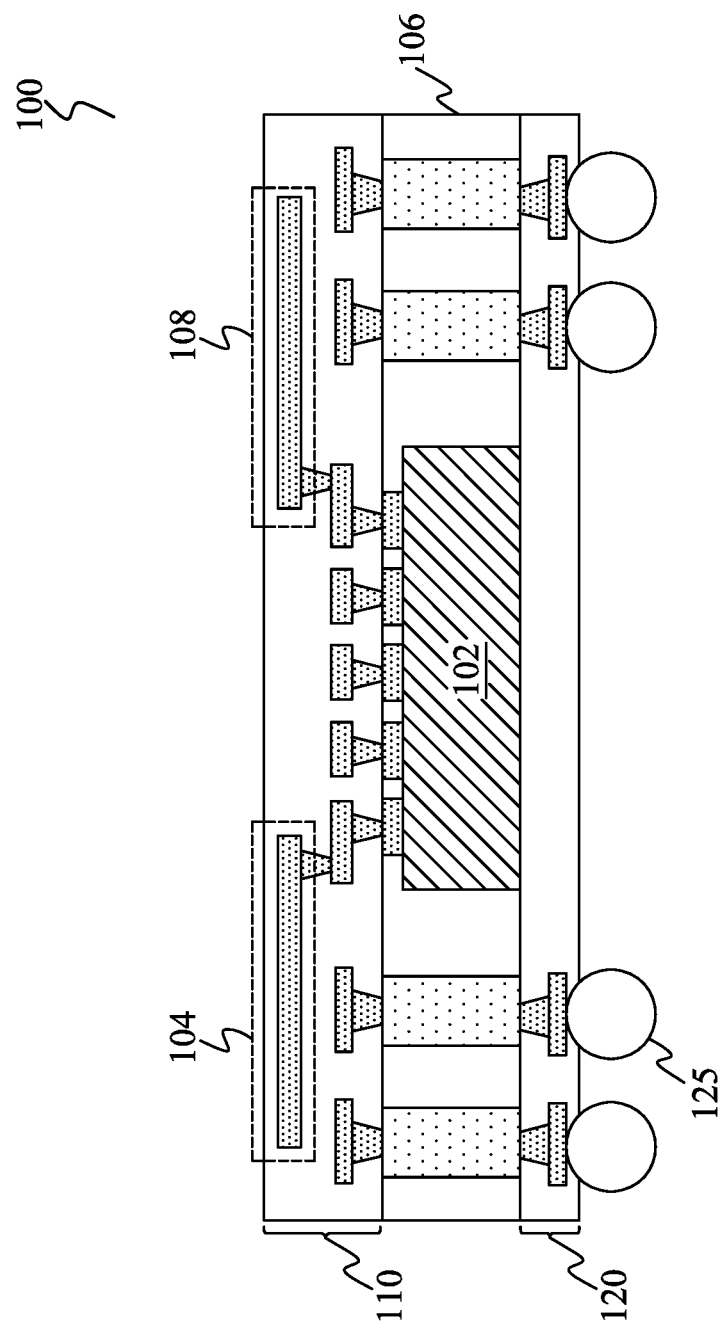
FIG. 1 illustrates a cross sectional view of a semiconductor device having a plurality of antenna structures in accordance with an embodiment.

FIG. 1 illustrates a cross sectional view of a semiconductor device having a plurality of antenna structures in accordance with an embodiment. The semiconductor device 100 comprises a semiconductor die 102 embedded in a molding compound layer 106. In order to give a basic insight of the inventive aspects of various embodiments, the semiconductor die 102 is drawn without details. However, it should be noted the semiconductor die 102 may comprise basic semiconductor layers such as active circuit layers, substrate layers, inter-layer dielectric (ILD) layers and inter-metal dielectric (IMD) layers (not shown).

In accordance with an embodiment, the semiconductor die 102 may comprise a plurality of logic circuits such as central processing unit (CPU), graphics processing unit (GPU) and the like. Alternatively, the semiconductor die 102 may comprise a plurality of memory circuits such as static random access memory (SRAM) and dynamic random access memory (DRAM) and the like. Furthermore, the semiconductor die 102 may comprise integrated circuits for radio frequency applications. It should be noted that the semiconductor die 102 may have many embodiments, which are also in the scope of the present disclosure.

As shown in FIG. 1, there may be a plurality of through vias formed in the molding compound layer 106. In addition, a plurality of redistribution layers formed on a first side of the semiconductor die 102 over the molding compound layer 106. The redistribution layers, the through vias and the semiconductor die 102 may form a fan-out package.

A plurality of dielectric layers 110 are subsequently formed on the first side of the semiconductor die 102 over the molding compound layer 106. There may be a plurality of through vias and post passivation interconnects in each dielectric layer. The post passivation interconnects in the top dielectric layer may function as antenna structures. As shown in FIG. 1, the antenna structures 104 and 108 are embedded in the top dielectric layer and electrically connected to the semiconductor die 102 through a conductive channel formed by a plurality of interconnects and through vias.

As shown in FIG. 1, a plurality of second side dielectric layers 120 are subsequently formed on a second side of the semiconductor die 102 over the molding compound layer 106. There may be redistribution layers and interconnects formed in the second side dielectric layers 120. Furthermore, a plurality of metal bumps 125 are formed over the second side dielectric layers 120.

As shown in FIG. 1, the metal bumps 125 are coupled to the semiconductor die 102 as well as the antenna structures 104 and 108. The formation processes of the semiconductor device 100 will be described in detail with respect to FIGS. 3A-19.

One advantageous feature of integrating antenna structure (e.g., antenna structures 104 and 108) into a fan-out wafer level package is that the antenna structures 104 and 108 shown in FIG. 1 provide a small form factor, low cost and low signal loss solution for a wireless communication system.

Figure 2:
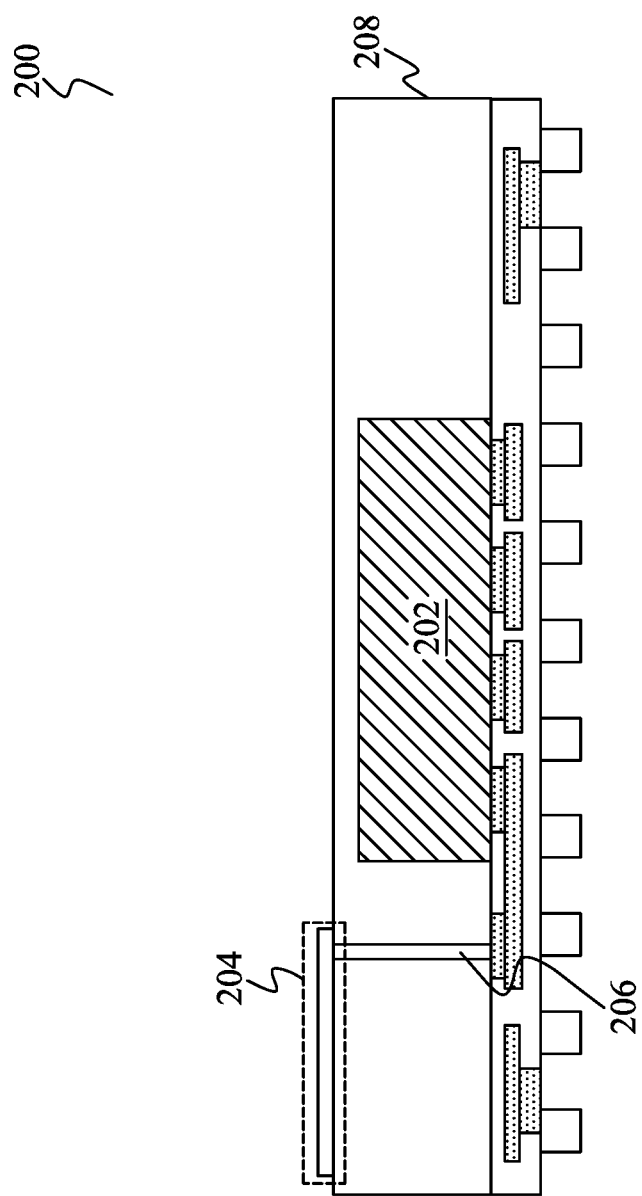
FIG. 2 illustrates a cross sectional view of a semiconductor device having a plurality of antenna structures in accordance with another embodiment.

FIG. 2 illustrates a cross sectional view of a semiconductor device having a plurality of antenna structures in accordance with another embodiment. As shown in FIG. 2, the structure of the semiconductor device 200 is similar to that of the semiconductor device 100 shown in FIG. 1 except that the antenna structure 204 is formed on a second side of the semiconductor die 202. The antenna structure 204 is electrically connected to the semiconductor die 202 through a through via 206 formed in the molding compound layer 208. As known in the art, the molding compound layer 208 may be formed of epoxy based resins and the like. The molding compound layer 208 can help to protect the semiconductor die 202 from heat, shock, humidity and corrosion. The detailed formation process of the semiconductor device 200 will be described below with respect to FIGS. 20-33.

It should be noted while FIG. 2 shows the antenna structure 204 is electrically connected to the semiconductor die 202 through a via formed in the molding compound layer 208, a person skilled in the art will recognize the through via 206 shown in FIG. 2 is merely an example, which should not unduly limit the scope of the claims. One of ordinary skill in the art would recognize many variations, alternatives, and modifications. For example, the through via 206 can be formed in the semiconductor die 202.

Figure 3A:
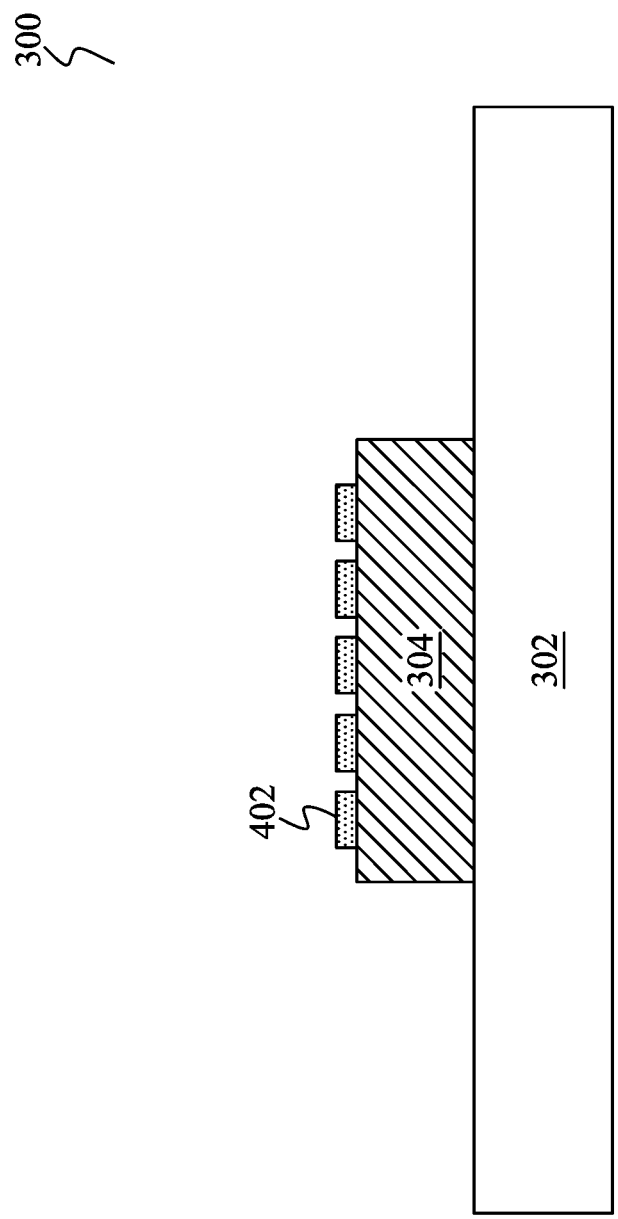
FIG. 3A illustrates a cross sectional view a semiconductor device in accordance with an embodiment.

FIGS. 3A-19 are cross sectional views of intermediate stages in the making of a semiconductor device having antenna structures in accordance with an embodiment. FIG. 3A illustrates a cross sectional view a semiconductor device in accordance with an embodiment. As shown in FIG. 3, a backside of a semiconductor die 304 is mounted on a carrier 302. A plurality of copper pillars are formed on the front side of the semiconductor die 304. The semiconductor die 304 may comprise a substrate, a plurality of ILD layers and IMD layers (not shown).

The substrate may be formed of silicon, although it may also be formed of other group III, group IV, and/or group V elements, such as silicon, germanium, gallium, arsenic, and combinations thereof. The substrate may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate may further comprise a variety of electrical circuits (not shown). The electrical circuits formed on the substrate may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

Throughout the description, the side of the semiconductor die having active circuits is alternatively referred to as the front side of the semiconductor die. On the other hand, the side of the semiconductor die not having active circuits is referred to as the backside of the semiconductor die. It should be noted that while FIG. 3 illustrates a single semiconductor die mounted on the carrier 302, the carrier 302 may accommodate any number of semiconductor dies.

FIG. 3B illustrates a cross sectional view a semiconductor device in accordance with another embodiment. The semiconductor device shown in FIG. 3B is similar to that shown in FIG. 3A except that the semiconductor die 304 is attached to the carrier 302 before the copper pillars are formed on the front side of the semiconductor die 304.

Figure 4A:
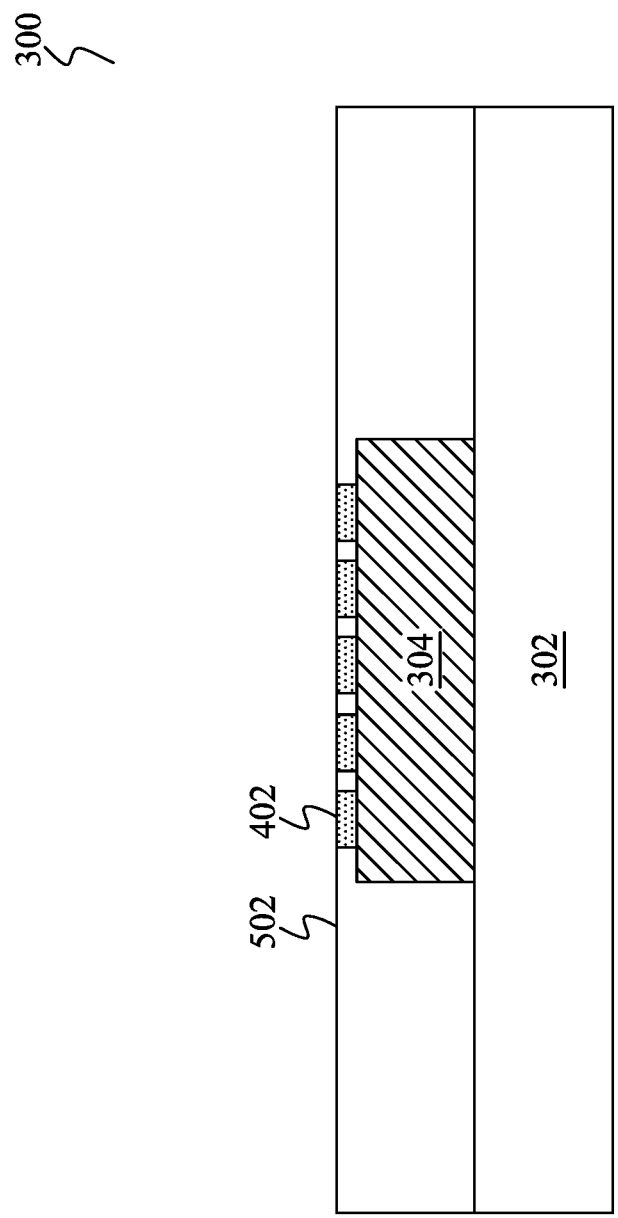
FIG. 4A illustrates a cross sectional view of the semiconductor device shown in FIG. 3A after a molding compound layer is formed over the semiconductor device in accordance with an embodiment.

FIG. 4A illustrates a cross sectional view of the semiconductor device shown in FIG. 3A after a molding compound layer is formed over the semiconductor device in accordance with an embodiment. The molding compound layer 502 is deposited over the carrier 302 through suitable semiconductor deposition techniques. As a result, the semiconductor die 304 is embedded in the molding compound layer 402 as shown in FIG. 4A.

The molding compound layer 502 may be formed of epoxy based resins and the like. Alternatively, the molding compound layer 502 may be replaced by photo-sensitive materials including polybenzoxazole (PBO), SU-8 photo-sensitive epoxy, film type polymer materials and/or the like.

In accordance with an embodiment, the molding compound layer 502 is either laminated or coated on the semiconductor die 304. One advantageous feature of having a molding compound layer laminated or coated on top of the semiconductor die 304 is that the effective die area of the semiconductor die 304 can be expanded so that a fan-out package can be formed based upon the molding compound layer 502. The detailed formation process of the fan-out package will be described below with respect to FIGS. 5A-19.

Figure 4B:
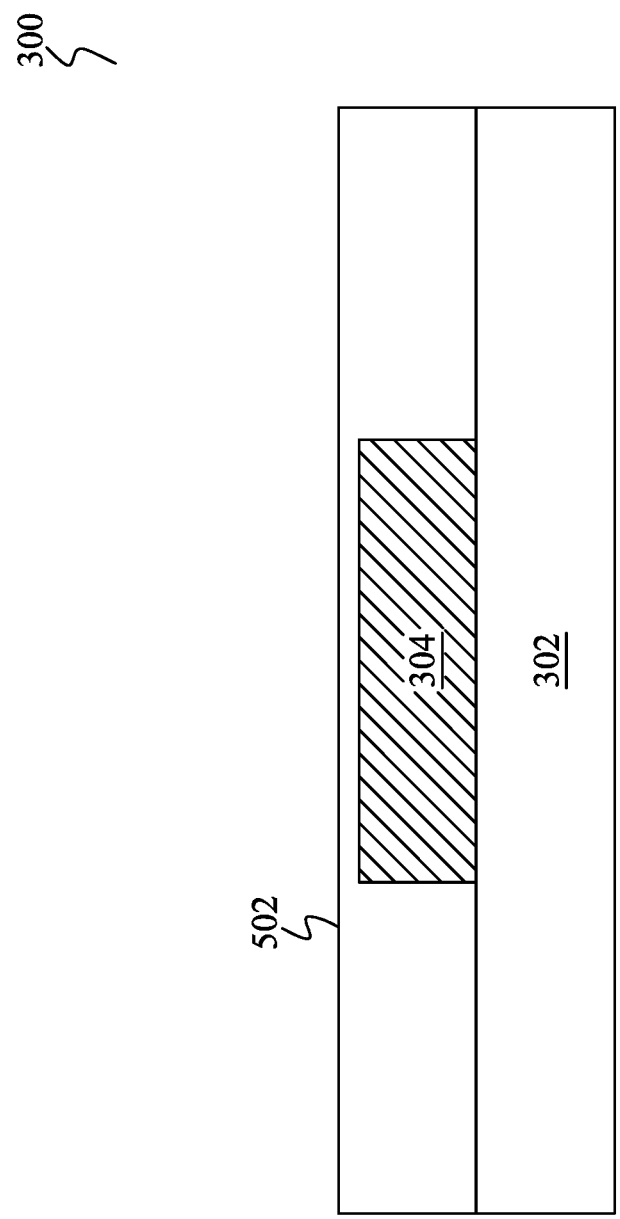
FIG. 4B illustrates a cross sectional view of the semiconductor device shown in FIG. 3B after a molding compound layer is formed over the semiconductor device in accordance with an embodiment.

FIG. 4B illustrates a cross sectional view of the semiconductor device shown in FIG. 3B after a molding compound layer is formed over the semiconductor device in accordance with an embodiment. The deposition process of FIG. 4B is similar to that of FIG. 4A, and hence is not discussed herein to avoid repetition.

Figure 5A:
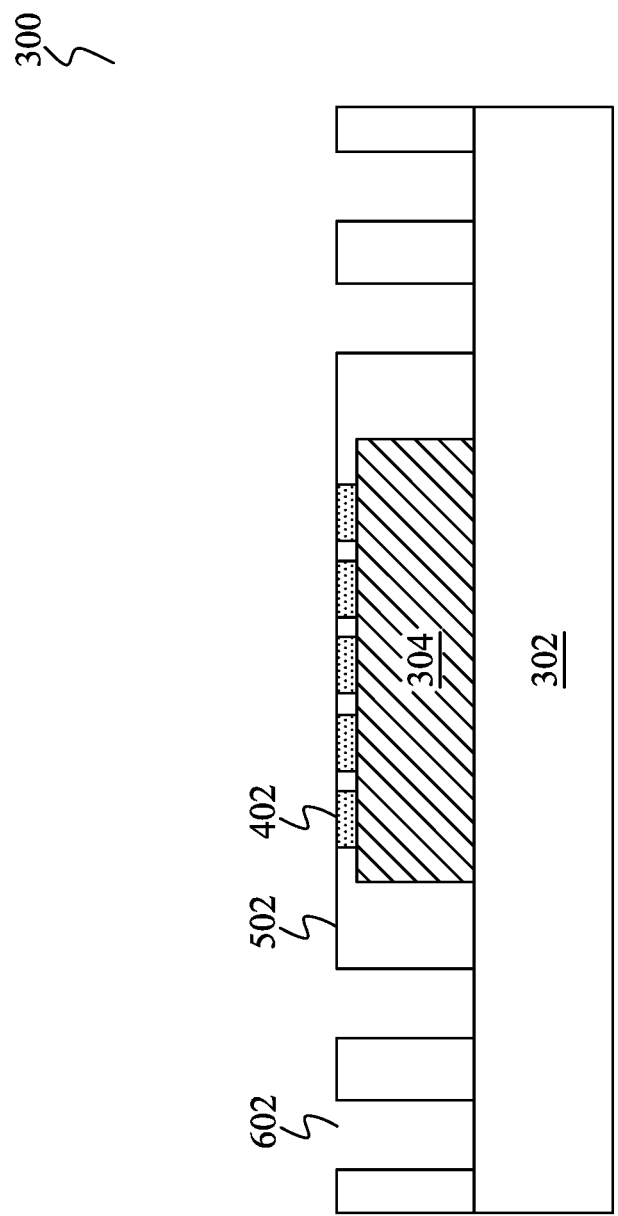
FIG. 5A illustrates a cross sectional view of the semiconductor device shown in FIG. 4A after a plurality of openings are formed in the molding compound layer in accordance with an embodiment.

FIG. 5A illustrates a cross sectional view of the semiconductor device shown in FIG. 4A after a plurality of openings are formed in the molding compound layer in accordance with an embodiment. In consideration of electrical and thermal needs, the molding compound layer 502 is patterned thorough a photolithography process. An etching process such as dry etching, wet etching and/or the like may be employed to remove selected areas of the molding compound layer 502. As a result, a variety of openings 602 are formed. As shown in FIG. 5A, the openings 602 extend through the molding compound layer 502.

Figure 5B:
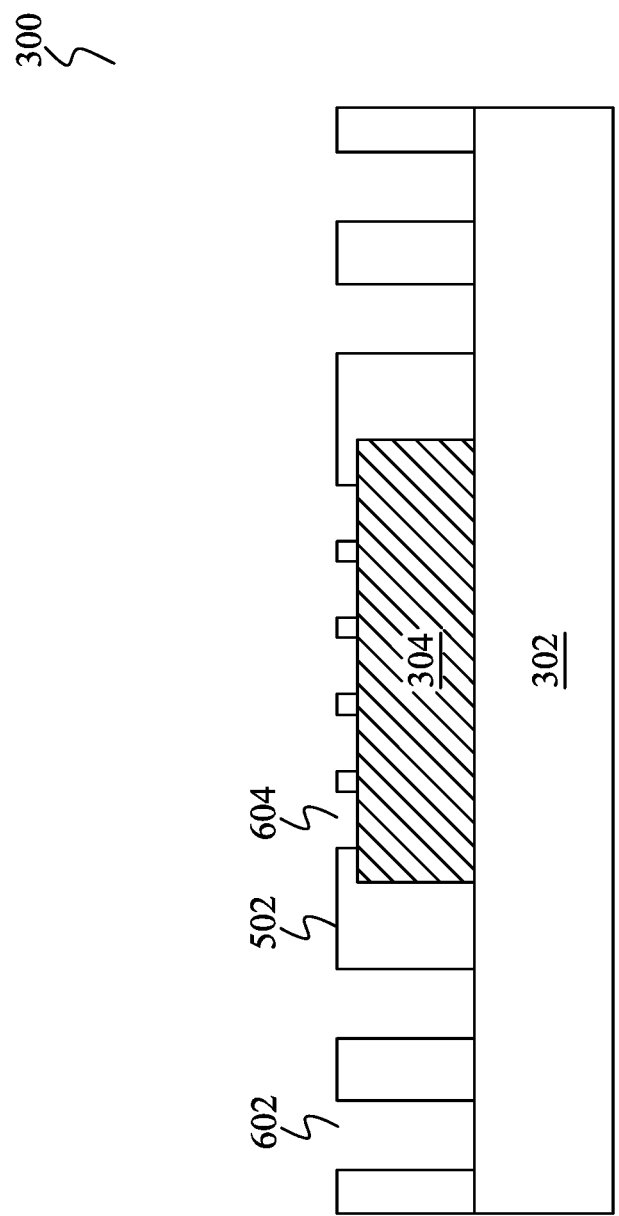
FIG. 5B illustrates a cross sectional view of the semiconductor device shown in FIG. 4B after a plurality of openings are formed in the molding compound layer in accordance with an embodiment.

FIG. 5B illustrates a cross sectional view of the semiconductor device shown in FIG. 4B after a plurality of openings are formed in the molding compound layer in accordance with an embodiment. The structure of FIG. 5B is similar to the structure of FIG. 5A except that openings 604 are formed on top of the semiconductor die 304. The opening formation method is similar to that described above with respect to FIG. 5A, and hence is not discussed herein.

Figure 6:
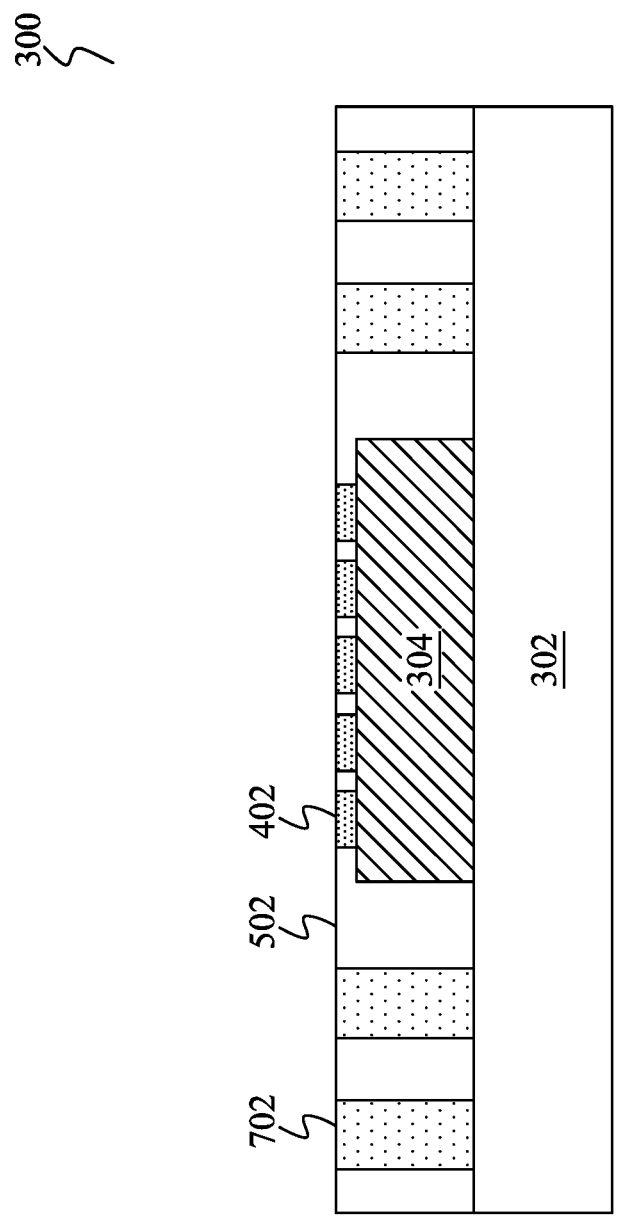
FIG. 6 illustrates a cross sectional view of the semiconductor device shown in FIG. 5 after a plurality of through vias are formed in the molding compound layer in accordance with an embodiment.

FIG. 6 illustrates a cross sectional view of the semiconductor device shown in FIG. 5A or FIG. 5B after a plurality of through vias are formed in the molding compound layer in accordance with an embodiment. As shown in FIG. 6, a conductive material fills the openings 602 (FIG. 5A and FIG. 5B) and 604 (FIG. 5B) using any suitable fabrication techniques such as an electroplating process. As a result, a plurality of through vias (e.g., through vias 702) are formed in the molding compound layer 502. The conductive material may be copper, but can be any suitable conductive materials such as copper alloys, aluminum, tungsten, silver, any combinations thereof and/or the like.

Figure 7:
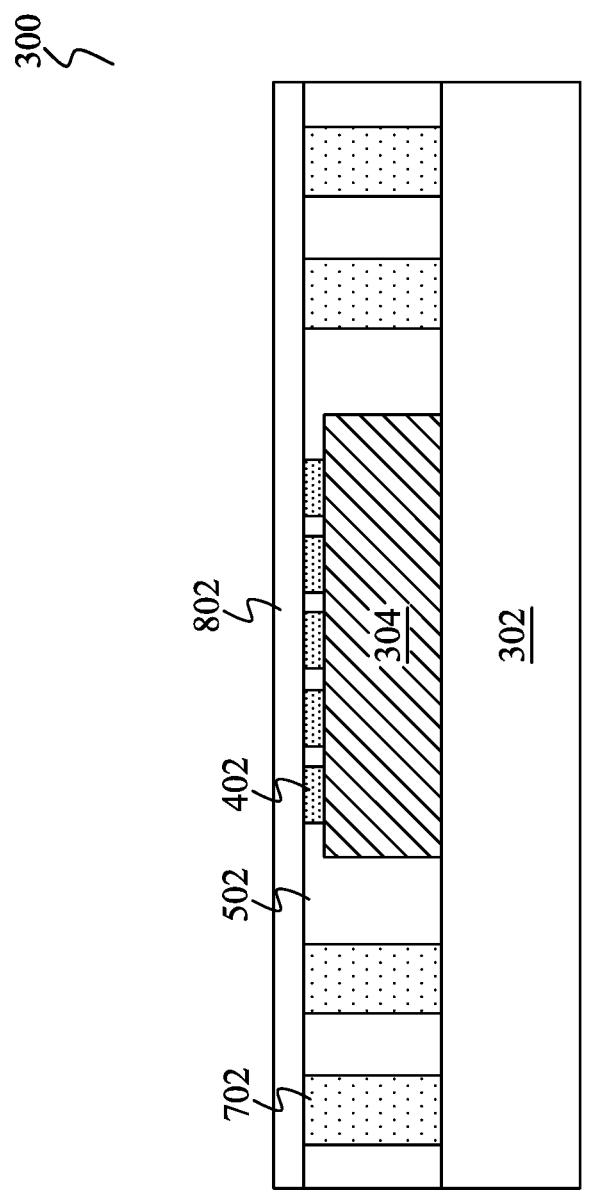
FIG. 7 illustrates a cross sectional view of the semiconductor device shown in FIG. 6 after a first dielectric layer is formed over the molding compound layer in accordance with an embodiment.

FIG. 7 illustrates a cross sectional view of the semiconductor device shown in FIG. 6 after a first dielectric layer is formed over the molding compound layer in accordance with an embodiment. A first dielectric layer 802 is formed on top of the molding compound layer 502. The first dielectric layer 802 may be formed of either photoresist materials or non-photoresist materials. In accordance with an embodiment, the first dielectric layer 802 may be formed of photoresist materials such as polybenzoxazole (PBO), SU-8 photo-sensitive epoxy, film type polymer materials and/or the like. The first dielectric layer 802 may be formed by suitable fabrication techniques such as spin coating and/or the like.

Figure 8:
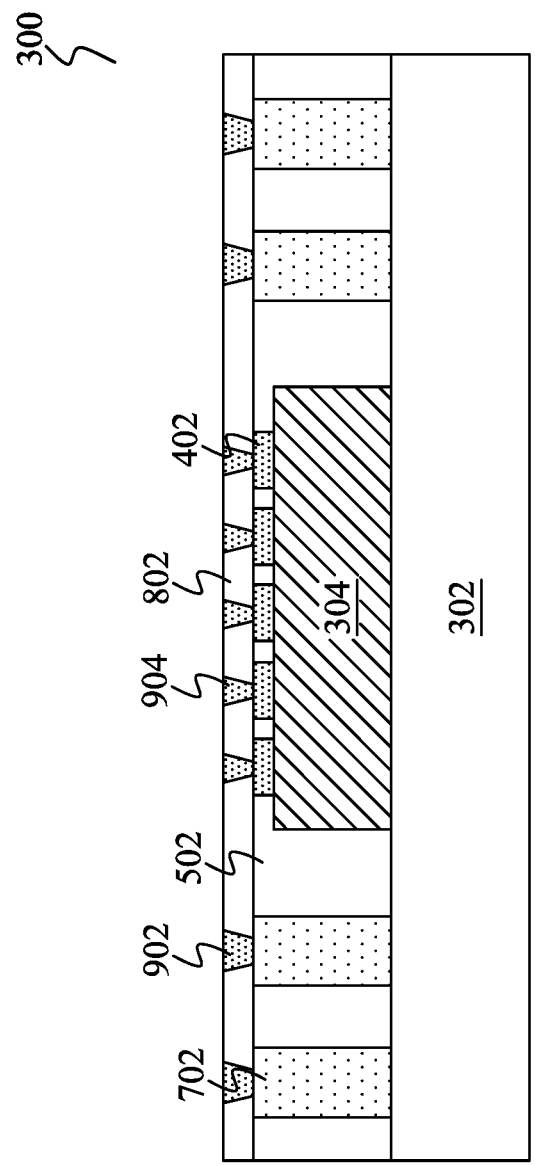
FIG. 8 illustrates a cross sectional view of the semiconductor device shown in FIG. 7 after a plurality of through vias are formed in the first dielectric layer in accordance with an embodiment.

FIG. 8 illustrates a cross sectional view of the semiconductor device shown in FIG. 7 after a plurality of interconnect vias are formed in the first dielectric layer in accordance with an embodiment. As shown in FIG. 8, the interconnect vias 902 are formed over the through vias and the interconnect vias 904 are formed over the semiconductor die 304. The interconnect vias 902 and 904 may be formed by any suitable fabrication techniques such as an electroplating process. Alternatively, the interconnect vias 902 and 904 may be formed by other techniques such as an electro-less plating process, chemical vapor deposition (CVD), and/or the like. The interconnect vias 902 and 904 may be formed of a conductive material. The conductive material may be copper, but can be any suitable conductive materials, such as copper alloys, aluminum, tungsten, silver, any combinations thereof and/or the like.

Figure 9:
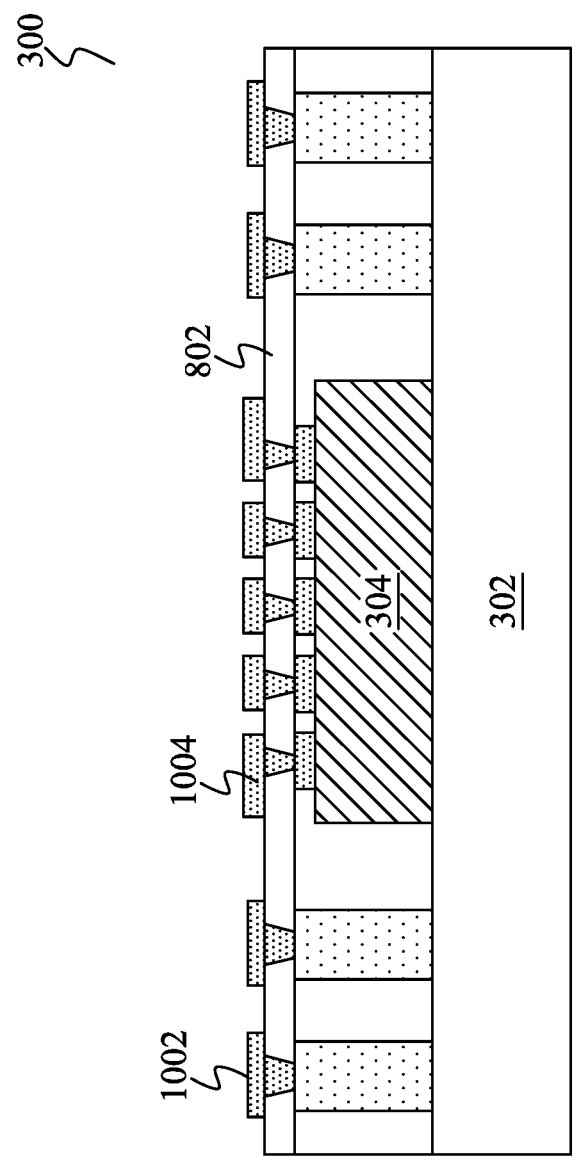
FIG. 9 illustrates a cross sectional view of the semiconductor device shown in FIG. 8 after first post passivation interconnects are formed over the first dielectric layer in accordance with an embodiment.

FIG. 9 illustrates a cross sectional view of the semiconductor device shown in FIG. 8 after first post passivation interconnects are formed over the first dielectric layer in accordance with an embodiment. The first post passivation interconnects 1002 and 1004 are formed on top of the first dielectric layer 802. As shown in FIG. 9, the first post passivation interconnects 1004 are coupled to the semiconductor die 304 through the through vias.

Figure 10:
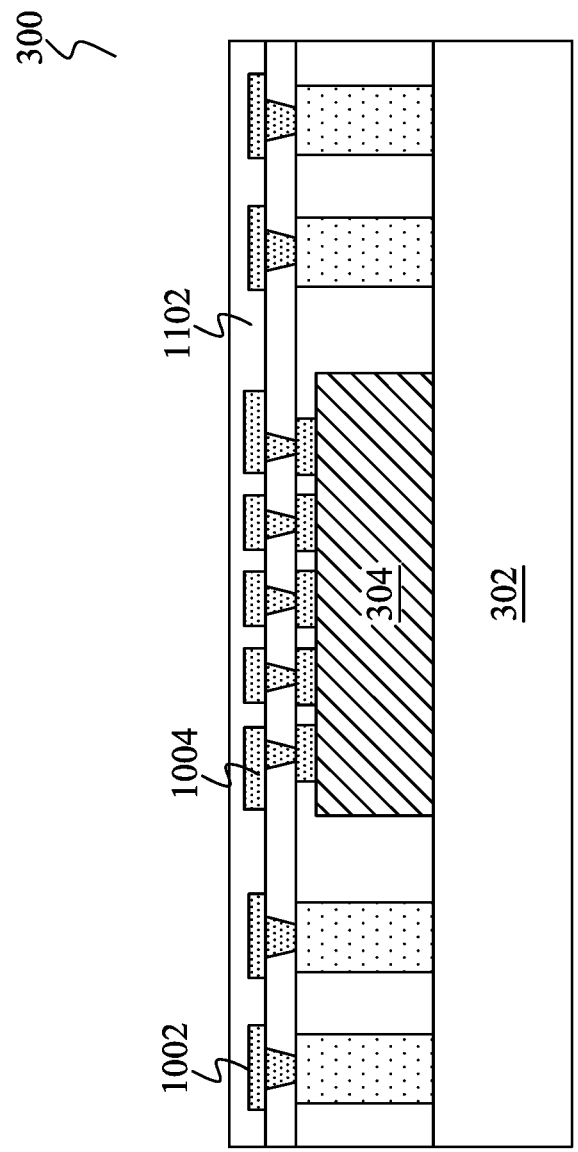
FIG. 10 illustrates a cross sectional view of the semiconductor device shown in FIG. 9 after a second dielectric layer is formed over the molding compound layer in accordance with an embodiment.

FIG. 10 illustrates a cross sectional view of the semiconductor device shown in FIG. 9 after a second dielectric layer is formed over the molding compound layer in accordance with an embodiment. A second dielectric layer 1102 is formed on top of the first dielectric layer 802. As shown in FIG. 10, the first post passivation interconnects 1002 and 1004 are embedded in the second dielectric layer 1102. The second dielectric layer 1102 may be formed of the same material as the first dielectric layer 802. In accordance with an embodiment, the second dielectric layer 1102 may be formed of suitable dielectric materials such as PBO and/or the like. The second dielectric layer 1102 may be formed by suitable fabrication techniques such as spin coating and/or the like.

Figure 11:
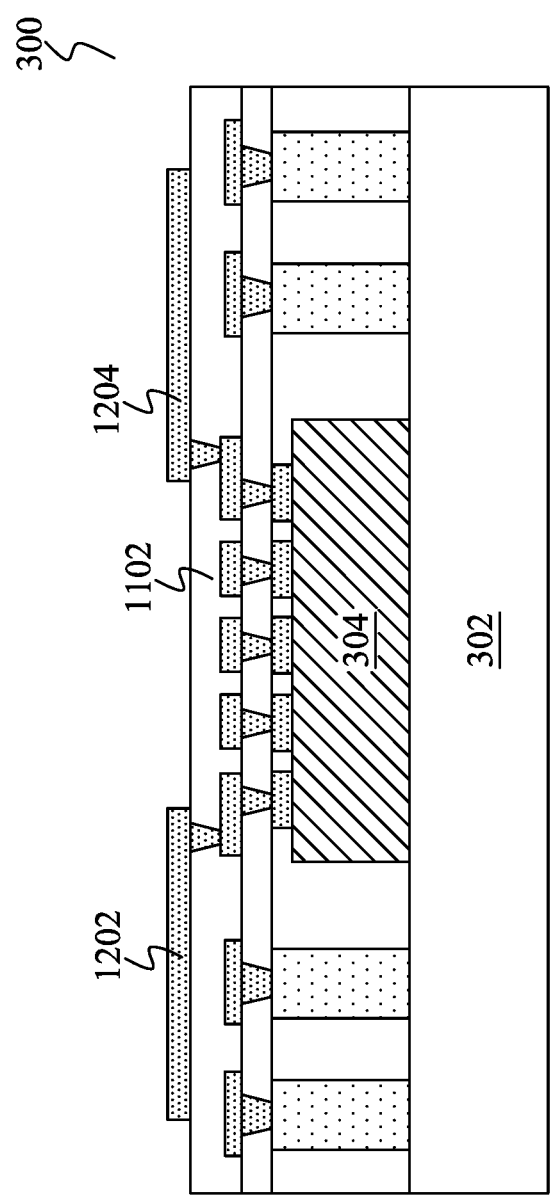
FIG. 11 illustrates a cross sectional view of the semiconductor device shown in FIG. 10 after second post passivation interconnects are formed over the second dielectric layer in accordance with an embodiment.

FIG. 11 illustrates a cross sectional view of the semiconductor device shown in FIG. 10 after second post passivation interconnects are formed over the second dielectric layer in accordance with an embodiment. Similar to the fabrication steps shown in FIG. 8, a plurality of interconnect vias are formed in the second dielectric layer 1102 and second post passivation interconnects 1202 and 1204 are formed on top of the second dielectric layer 1102. It should be noted that the second post passivation interconnects 1202 and 1204 may function as antenna structures (e.g., antenna structures 104 and 108 shown in FIG. 1) of the semiconductor device. The antenna structures 1202 and 1204 are electrically connected to the semiconductor die 304 through a short transmission path formed by a few through vias and interconnects.

FIG. 11 illustrates the antenna structures 1202 and 1204 are formed in the second dielectric layer 1102. This cross sectional view of FIG. 11 is merely an example, which should not unduly limit the scope of the claims. One of ordinary skill in the art would recognize many variations, alternatives, and modifications. For example, there may be additional dielectric layers, through vias and interconnects between the antenna structures 1202, 1204 and the semiconductor die 304.

One advantageous feature of the antenna structures 1202 and 1204 shown in FIG. 11 is that the signal transmission path from the antenna structures 1202 and 1204 to the semiconductor die 304 is very short. As such, the signal losses of a wireless system based upon the antenna structure shown in FIG. 11 can be reduced.

Figure 12:
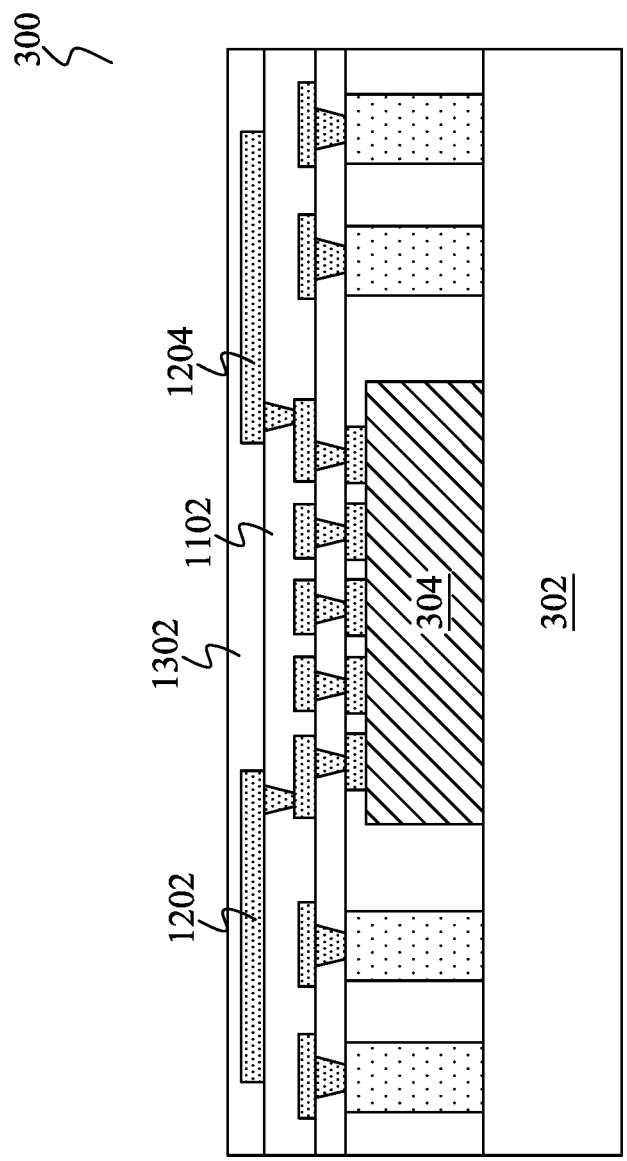
FIG. 12 illustrates a cross sectional view of the semiconductor device shown in FIG. 11 after a third dielectric layer is formed over the second dielectric layer in accordance with an embodiment.

FIG. 12 illustrates a cross sectional view of the semiconductor device shown in FIG. 11 after a third dielectric layer is formed over the second dielectric layer in accordance with an embodiment. A third dielectric layer 1302 is formed on top of the second dielectric layer 1102. As shown in FIG. 12, the antenna structures 1204 and 1204 are embedded in the third dielectric layer 1302. The third dielectric layer 1302 may be formed of the same material as the first dielectric layer 802 and the second dielectric layer 1102. In accordance with an embodiment, the third dielectric layer 1302 may be formed of suitable dielectric materials such as PBO and/or the like. The third dielectric layer 1302 may be formed by suitable fabrication techniques such as spin coating and/or the like.

Figure 13:
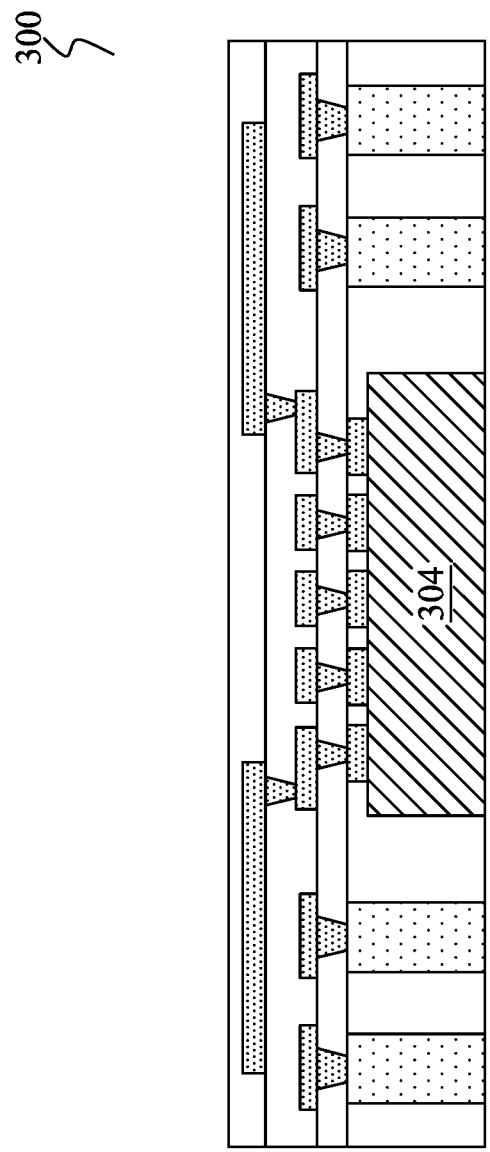
FIG. 13 illustrates a process of removing the carrier from a semiconductor device.

FIG. 13 illustrates a process of removing the carrier from a semiconductor device. In accordance with an embodiment, the carrier 302 (shown in FIG. 12) can be detached from the semiconductor device. A variety of detaching processes may be employed to separate the semiconductor device from the carrier 302. The variety of detaching processes may comprise a chemical solvent, a UV exposure and/or the like.

Figure 14:
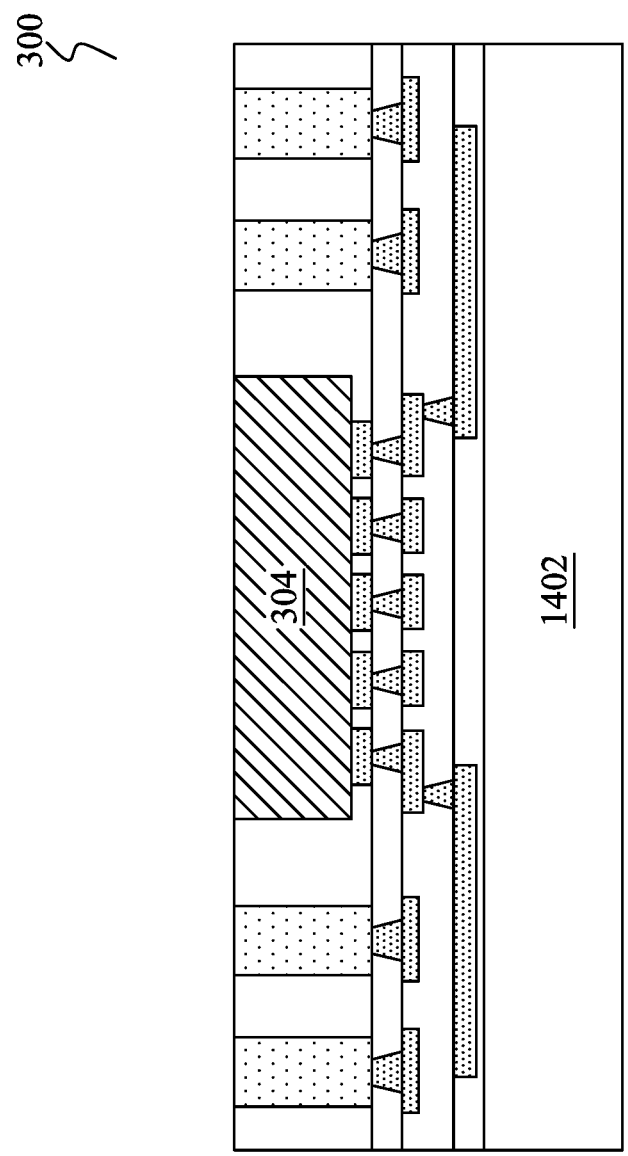
FIG. 14 illustrates a cross sectional view of the semiconductor device shown in FIG. 13 after the semiconductor device is flipped and attached to a carrier in accordance with an embodiment.

FIG. 14 illustrates a cross sectional view of the semiconductor device shown in FIG. 13 after the semiconductor device is flipped and attached to a carrier in accordance with an embodiment. After the semiconductor device has been detached from the carrier, the semiconductor device is flipped. Subsequently, the front side of the semiconductor device is mounted on a carrier 1402.

Figure 15:
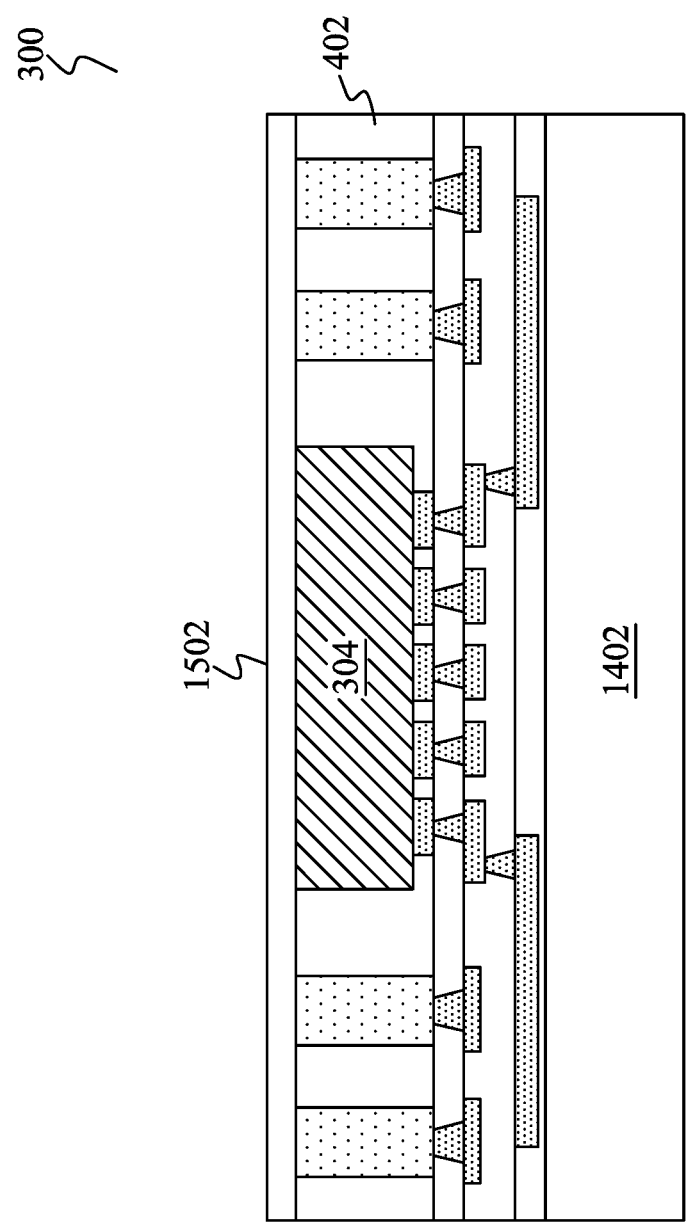
FIG. 15 illustrates a cross sectional view of the semiconductor device shown in FIG. 14 after a first backside dielectric layer is formed over the molding compound layer in accordance with an embodiment.

FIG. 15 illustrates a cross sectional view of the semiconductor device shown in FIG. 14 after a first backside dielectric layer is formed over the molding compound layer in accordance with an embodiment. The first backside dielectric layer 1502 is formed on top of the molding compound layer 402 over the backside of the semiconductor die 304.

The first backside dielectric layer 1502 may be formed of either photoresist materials or non-photoresist materials. In accordance with an embodiment, the first backside dielectric layer 1502 may be formed of any suitable dielectric materials such as PBO, SU-8 photo-sensitive epoxy, film type polymer materials and/or the like. The first backside dielectric layer 1502 may be formed by any suitable semiconductor fabrication techniques such as spin coating and/or the like.

Figure 16:
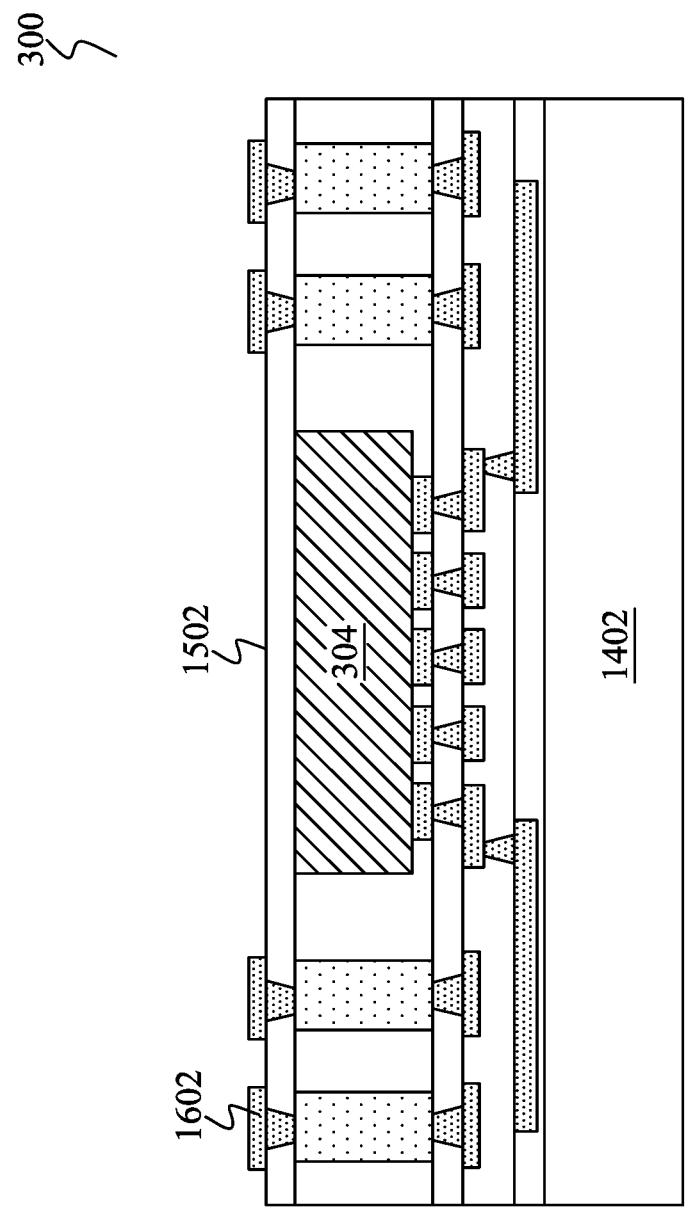
FIG. 16 illustrates a cross sectional view of the semiconductor device shown in FIG. 15 after backside post passivation interconnects are formed over the first backside dielectric layer in accordance with an embodiment.

FIG. 16 illustrates a cross sectional view of the semiconductor device shown in FIG. 15 after backside post passivation interconnects are formed over the first backside dielectric layer in accordance with an embodiment. Similar to the fabrication steps shown in FIG. 11, a plurality of interconnect vias are formed in the first backside dielectric layer 1502 and backside post passivation interconnects 1602 are formed on top of the first backside dielectric layer 1502.

Figure 17:
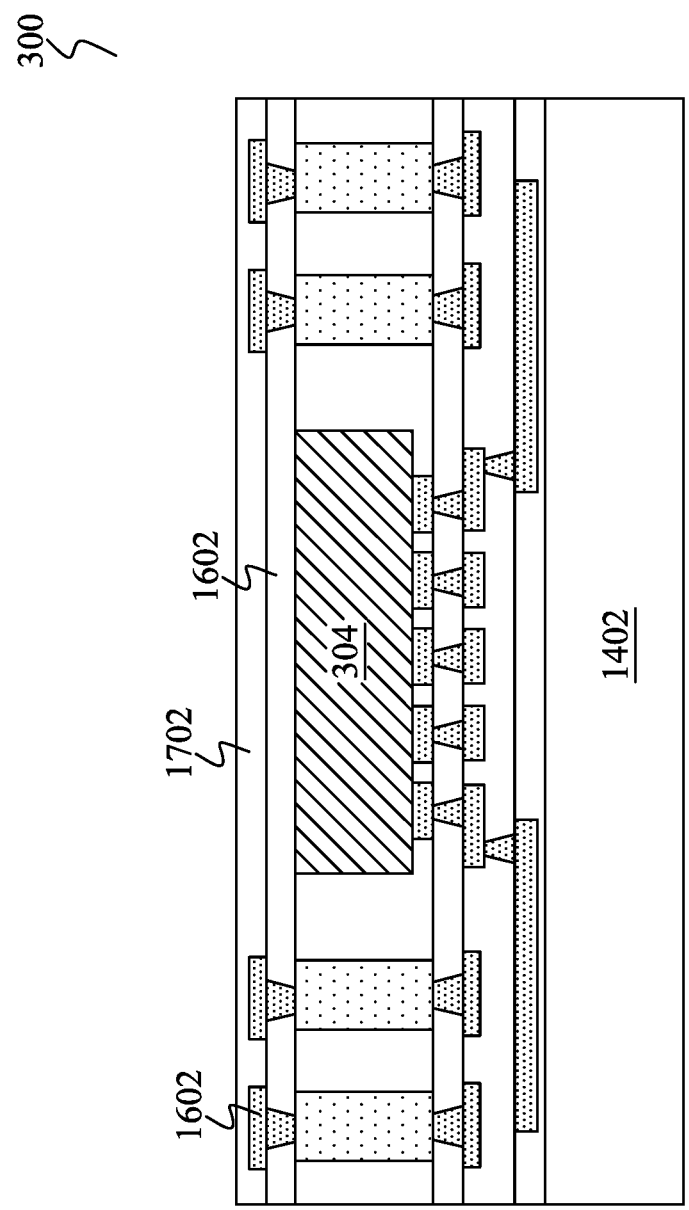
FIG. 17 illustrates a cross sectional view of the semiconductor device shown in FIG. 16 after a second backside dielectric layer is formed over the first backside dielectric layer in accordance with an embodiment.

FIG. 17 illustrates a cross sectional view of the semiconductor device shown in FIG. 16 after a second backside dielectric layer is formed over the first backside dielectric layer in accordance with an embodiment. A second backside dielectric layer 1702 is formed on top of the first backside dielectric layer 1502. As shown in FIG. 17, backside post passivation interconnects 1602 are embedded in the second backside dielectric layer 1702. The second backside dielectric layer 1702 may be formed of the same dielectric material as the first backside dielectric layer 1502.

In accordance with an embodiment, the second backside dielectric layer 1702 may be formed of suitable dielectric materials such as PBO and/or the like. The second backside dielectric layer 1702 may be formed by suitable fabrication techniques such as spin coating and/or the like.

Figure 18:
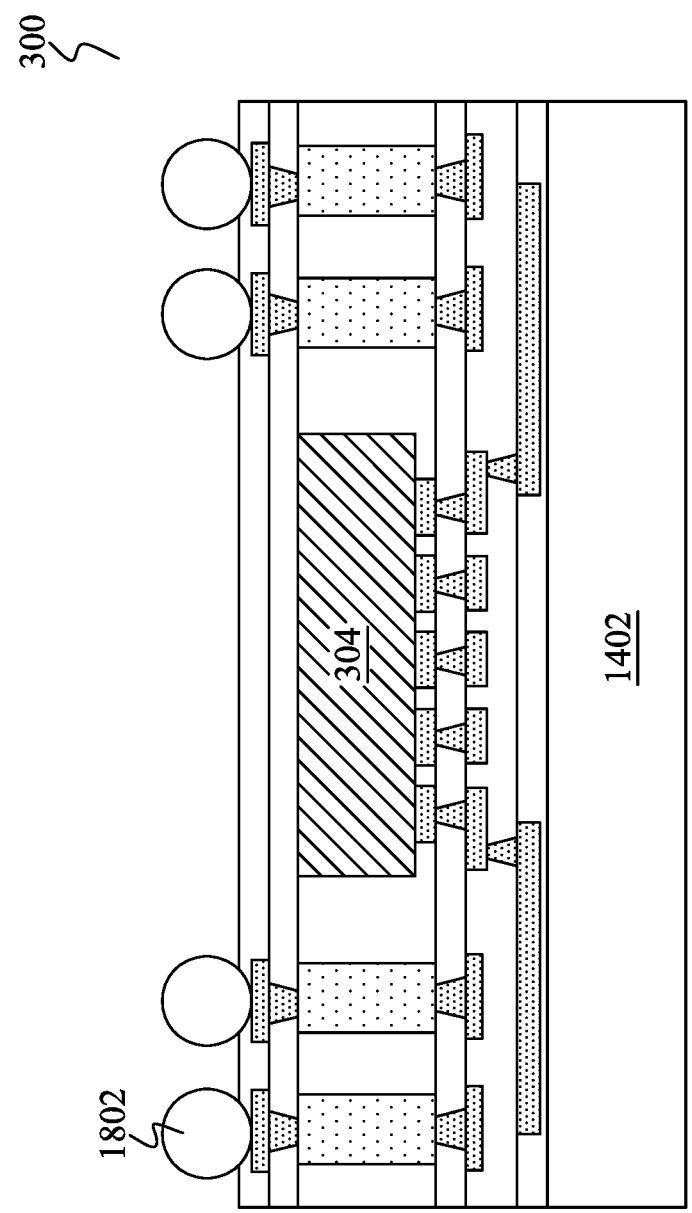
FIG. 18 illustrates the formation of a plurality of under bump metallization structures and metal bumps in accordance with an embodiment.

FIG. 18 illustrates the formation of a plurality of under bump metallization structures and metal bumps in accordance with an embodiment. The plurality of under bump metallization structures (not shown) are formed between the post passivation interconnects and the metal bumps 1802. The under bump metallization structures help to prevent diffusion between the metal bumps 1802 and the integrated circuits of the semiconductor device, while providing a low resistance electrical connection. The metal bumps 1802 are input/output (I/O) pads of the semiconductor device. In accordance with an embodiment, the metal bumps 1802 may be a plurality of solder balls. Alternatively, the metal bumps 1802 may be a plurality of land grid array (LGA) pads.

Figure 19:
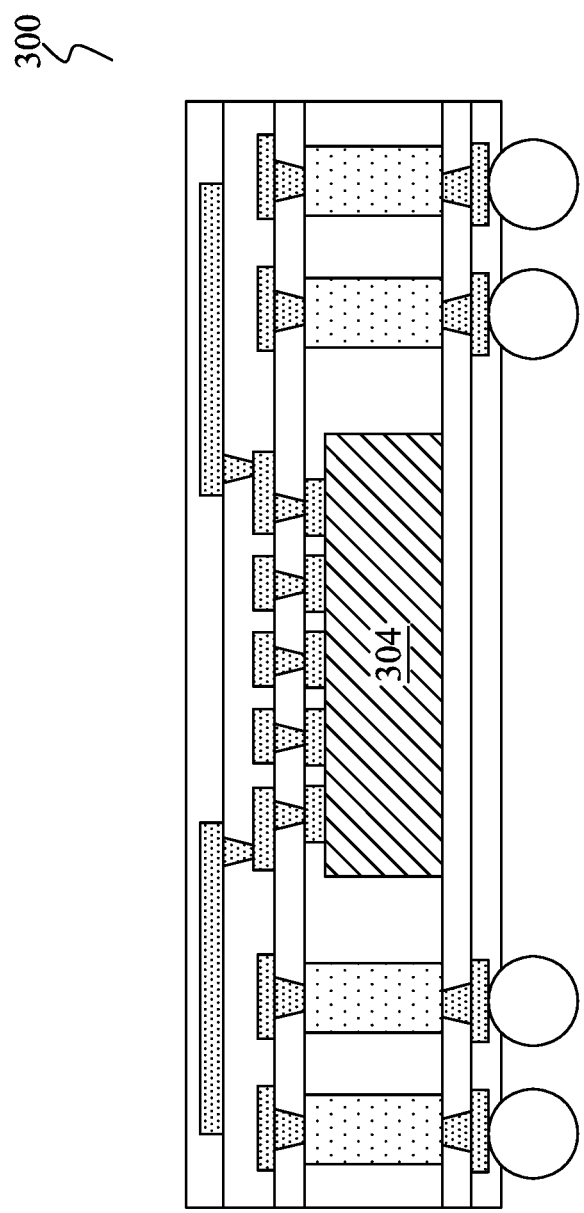
FIG. 19 illustrates a process of removing the carrier from the semiconductor device.
Figure 20:
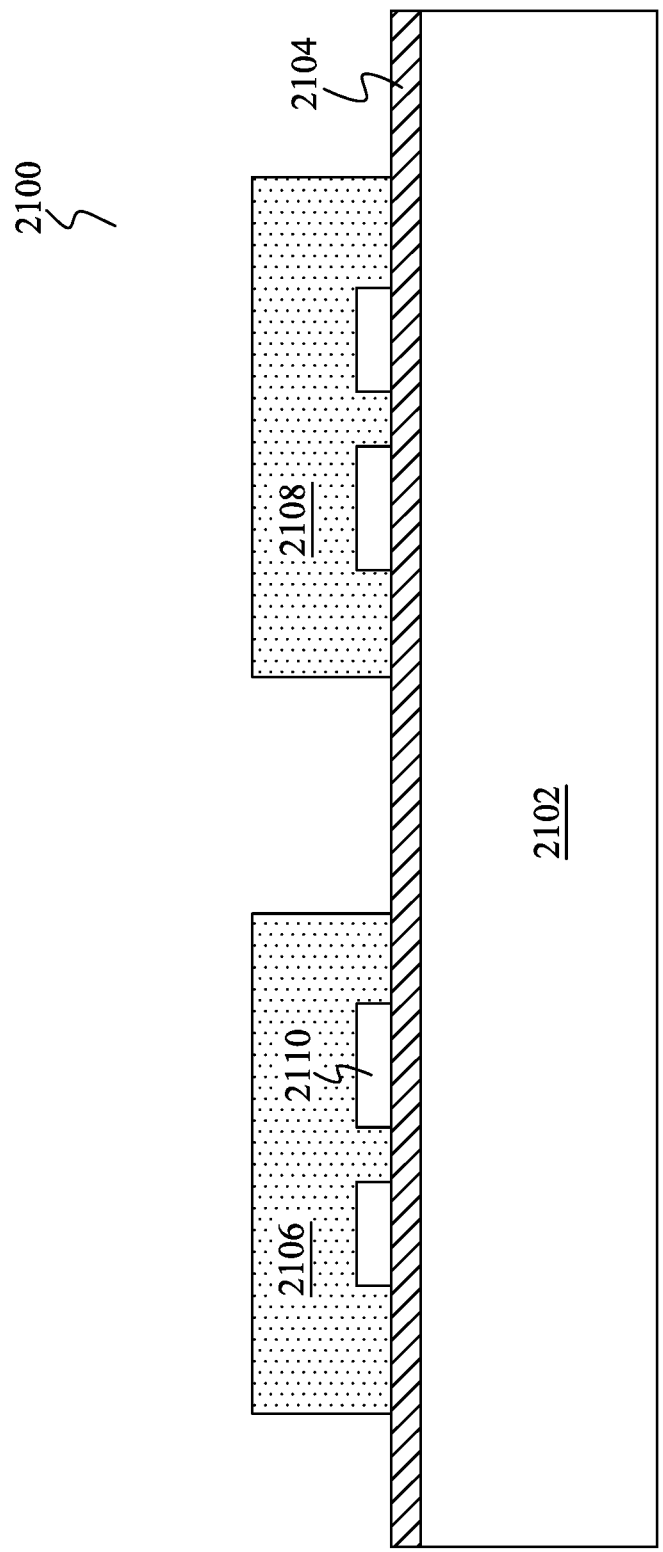
FIGS. 20-33 are cross sectional views of intermediate stages in the making of another semiconductor device having antenna structures in accordance with an embodiment.
Figure 21:
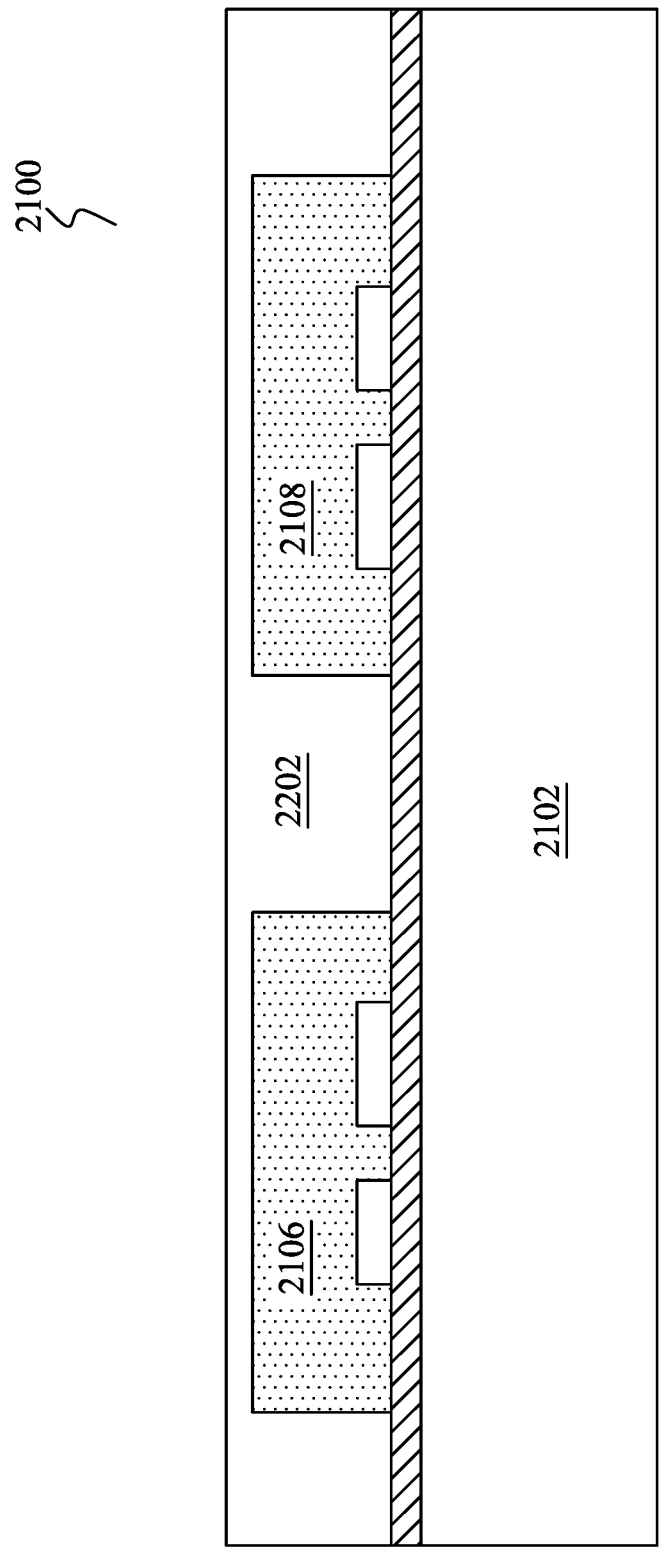
Figure 22:
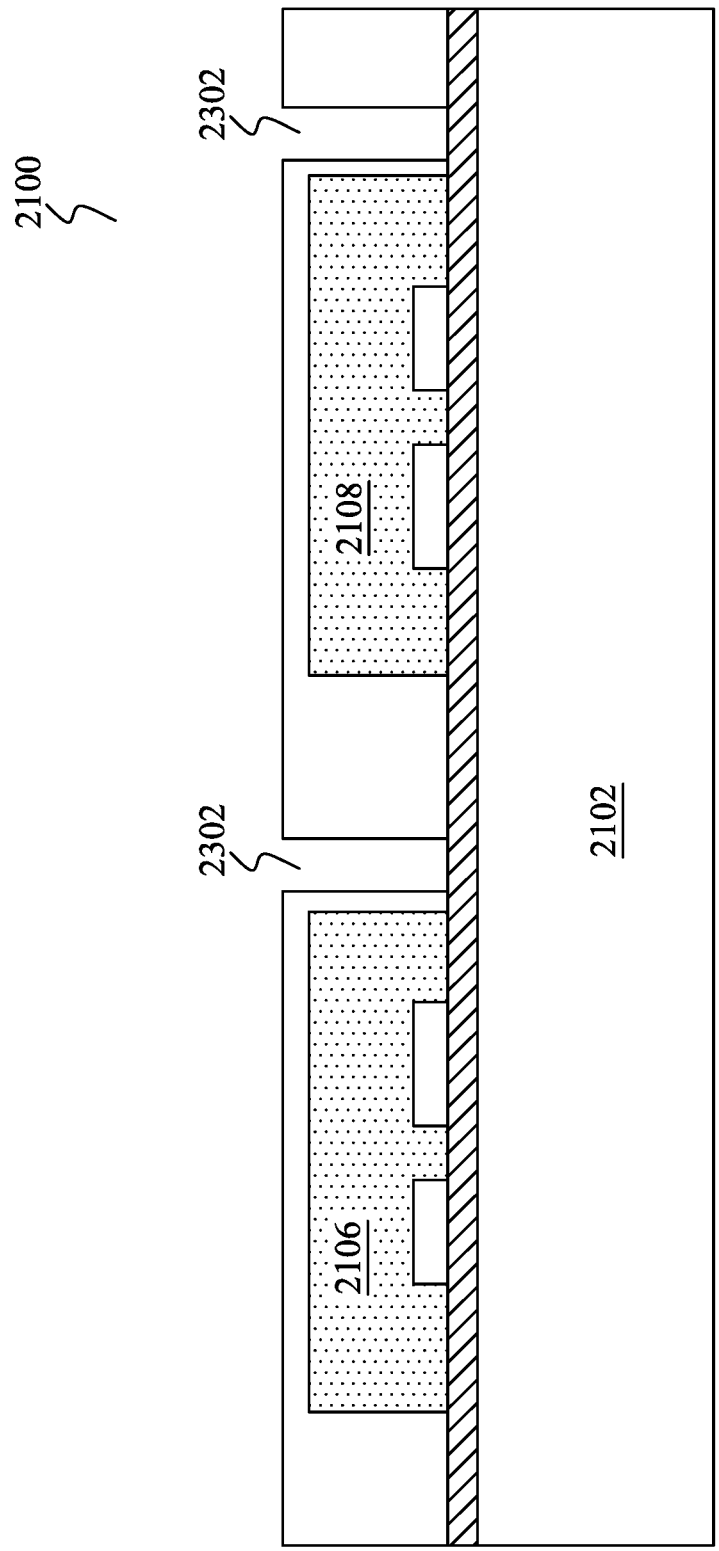
Figure 23:
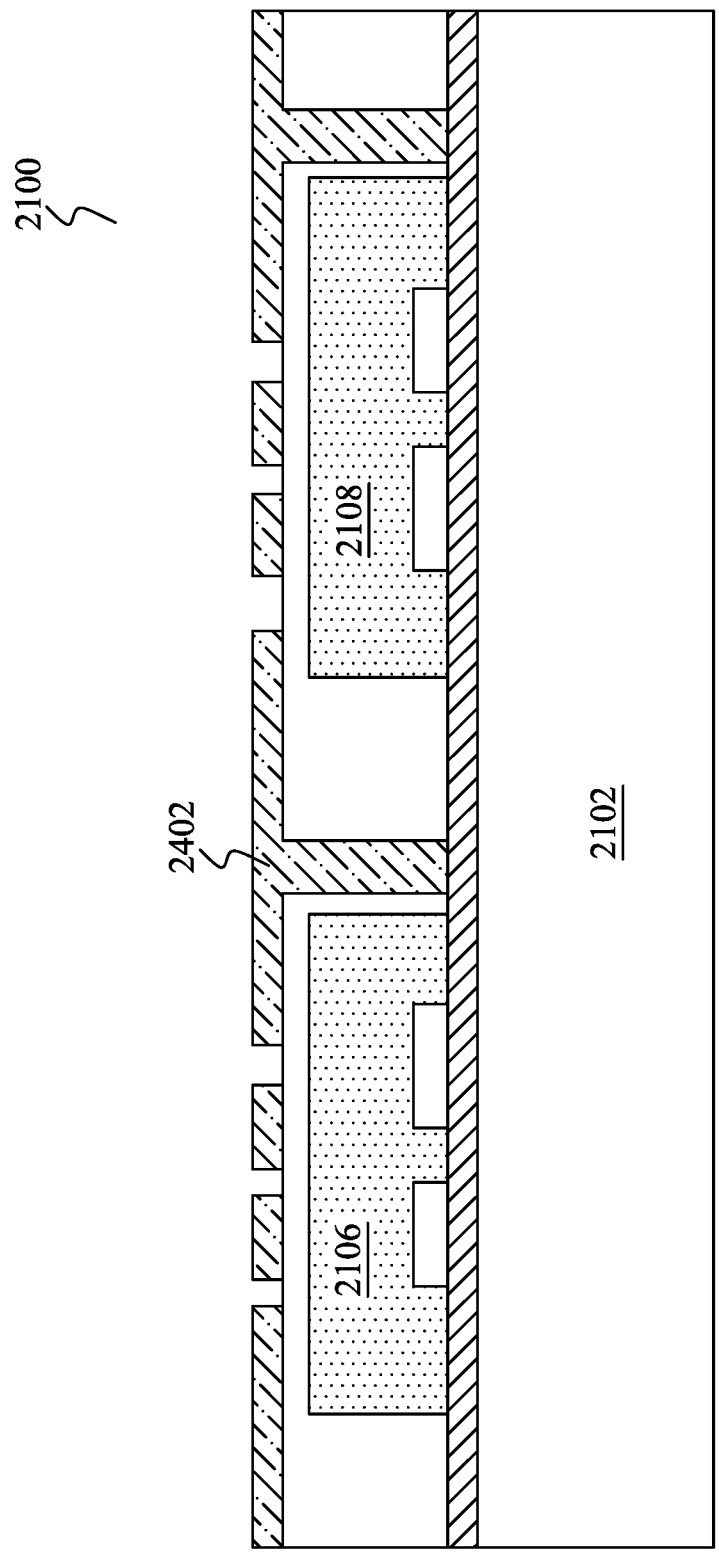
Figure 24:
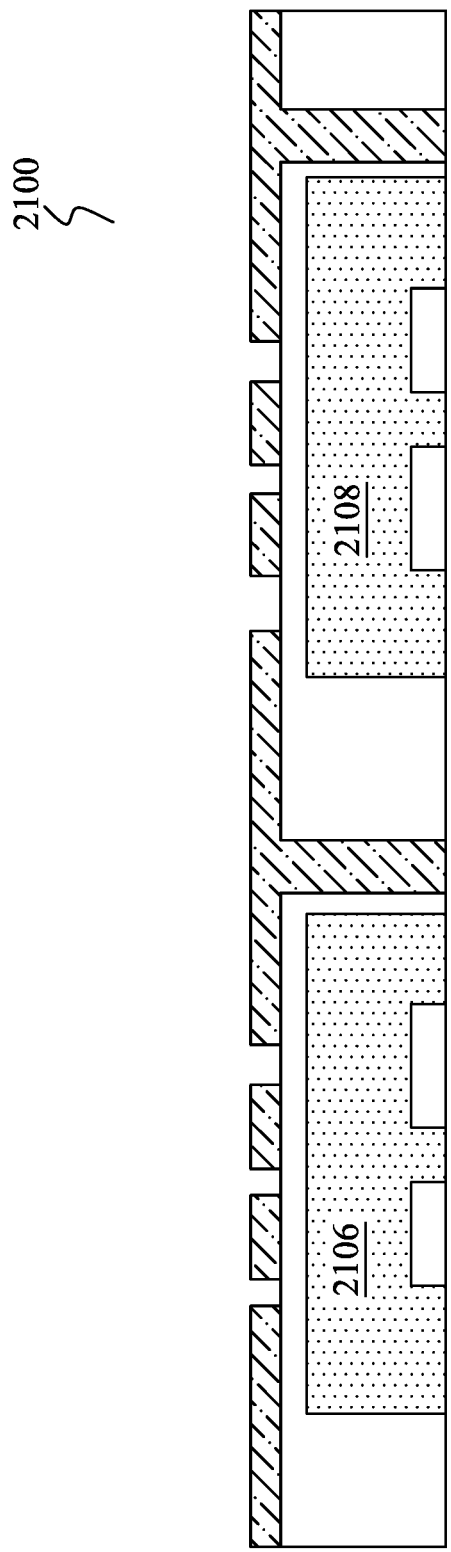
Figure 25:
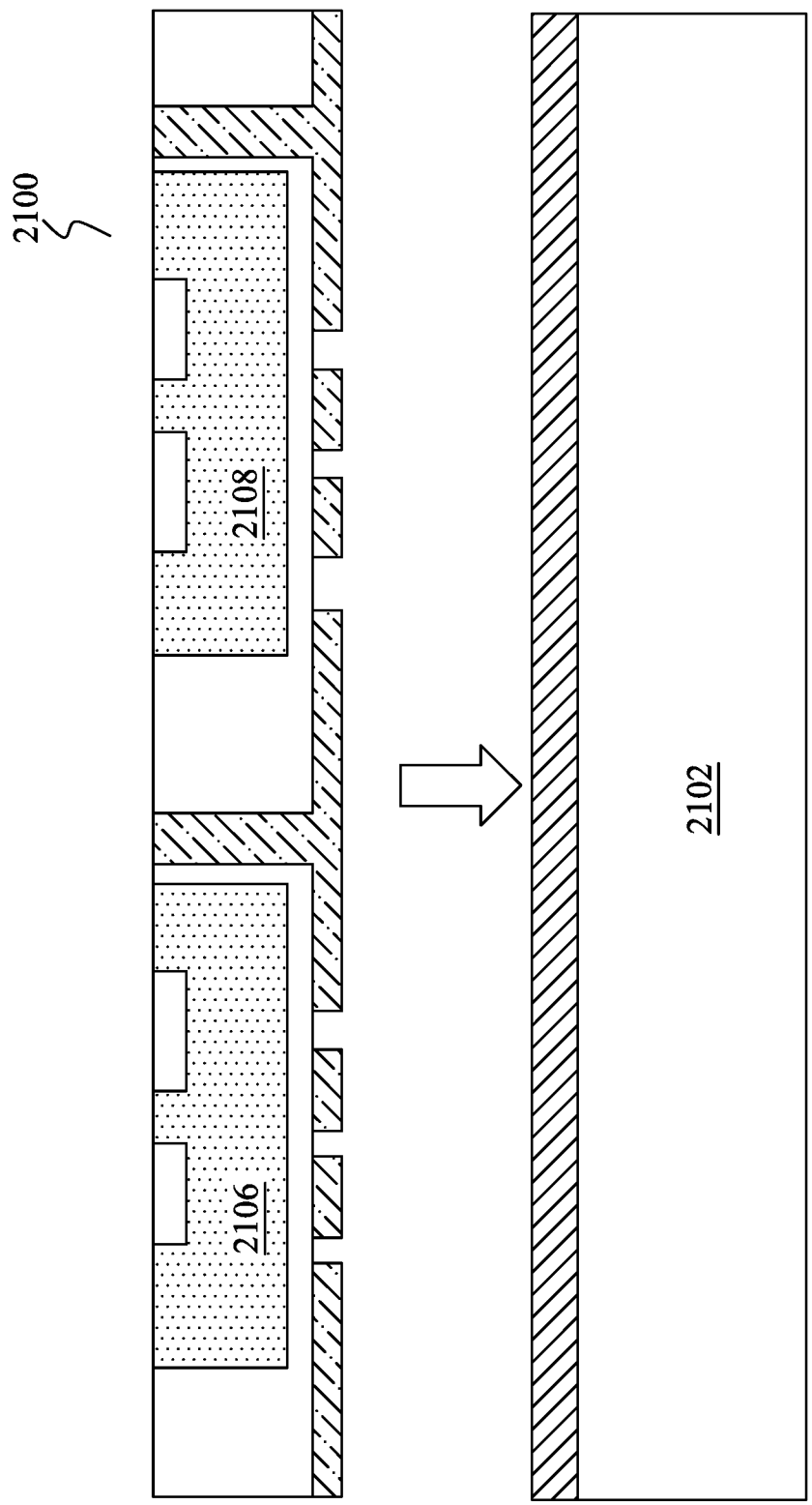
Figure 26:
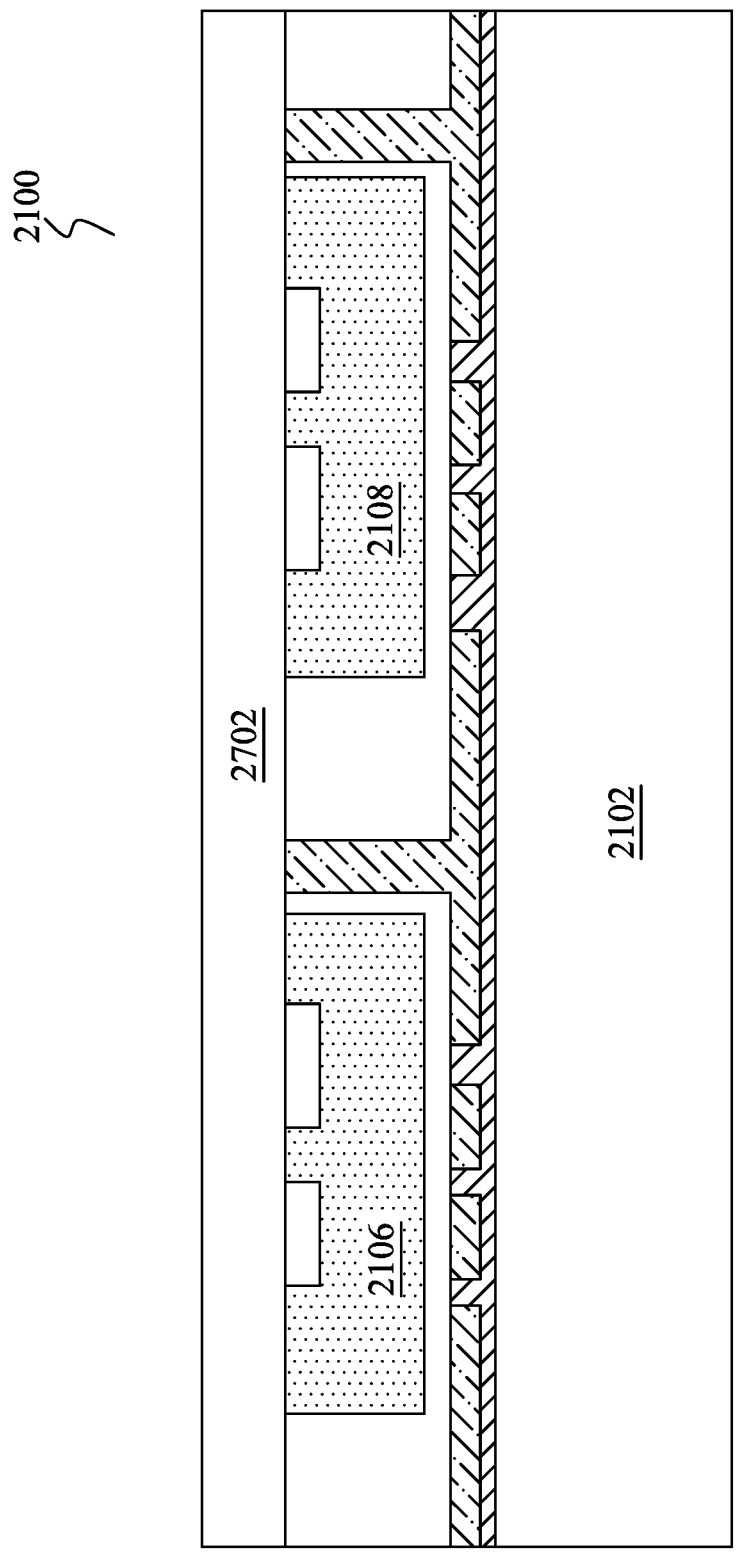
Figure 27:
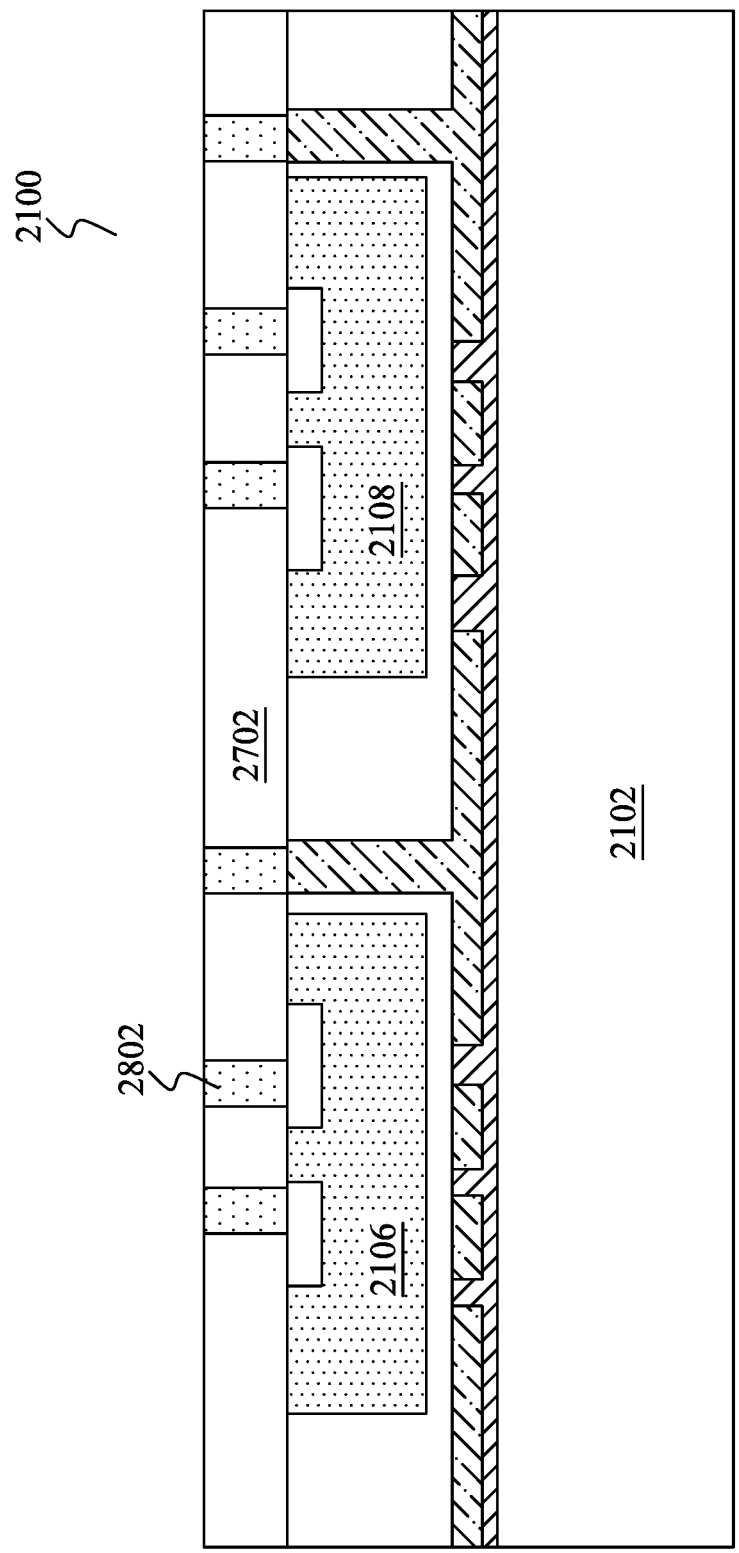
Figure 28:
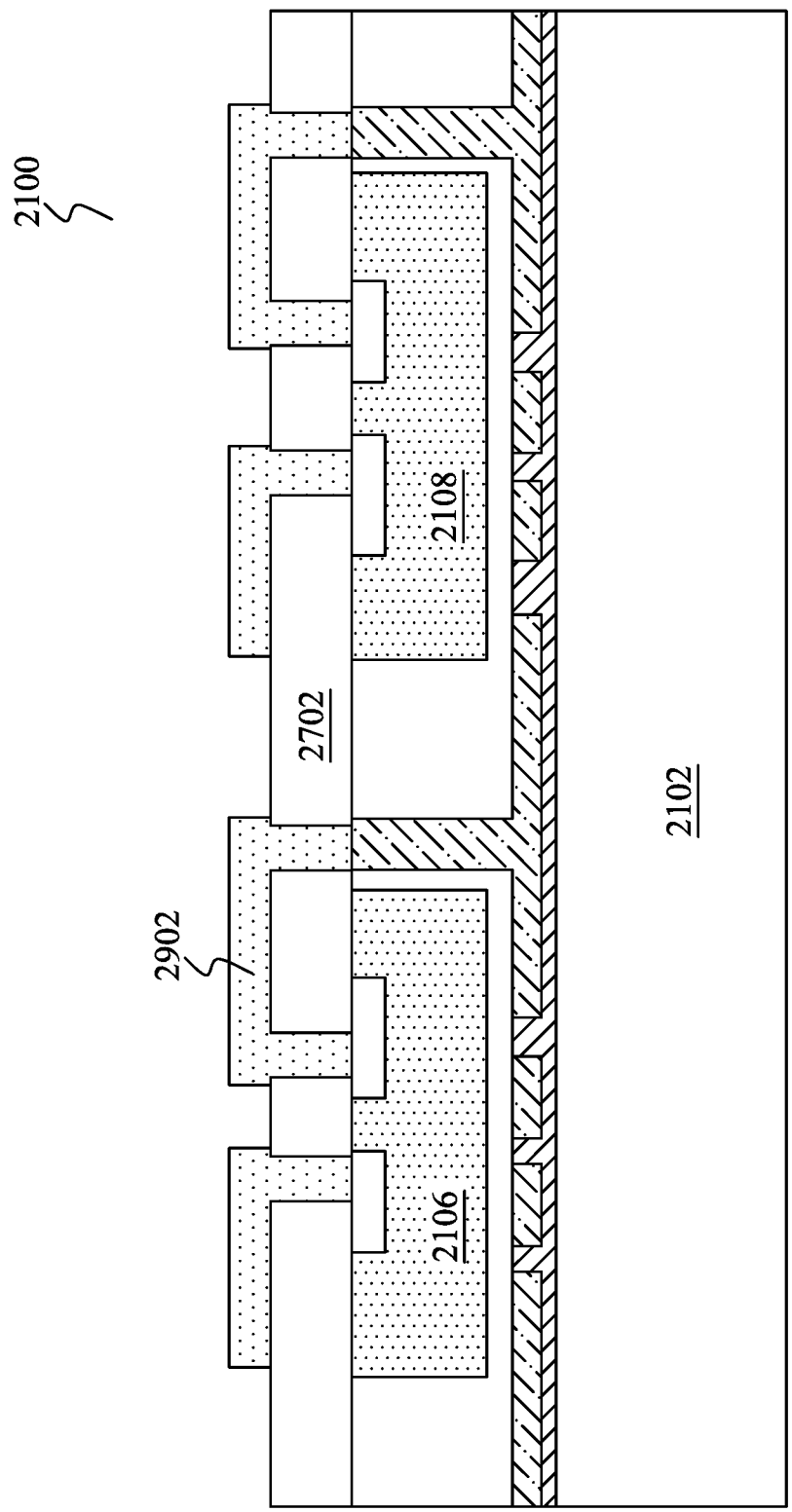
Figure 29:
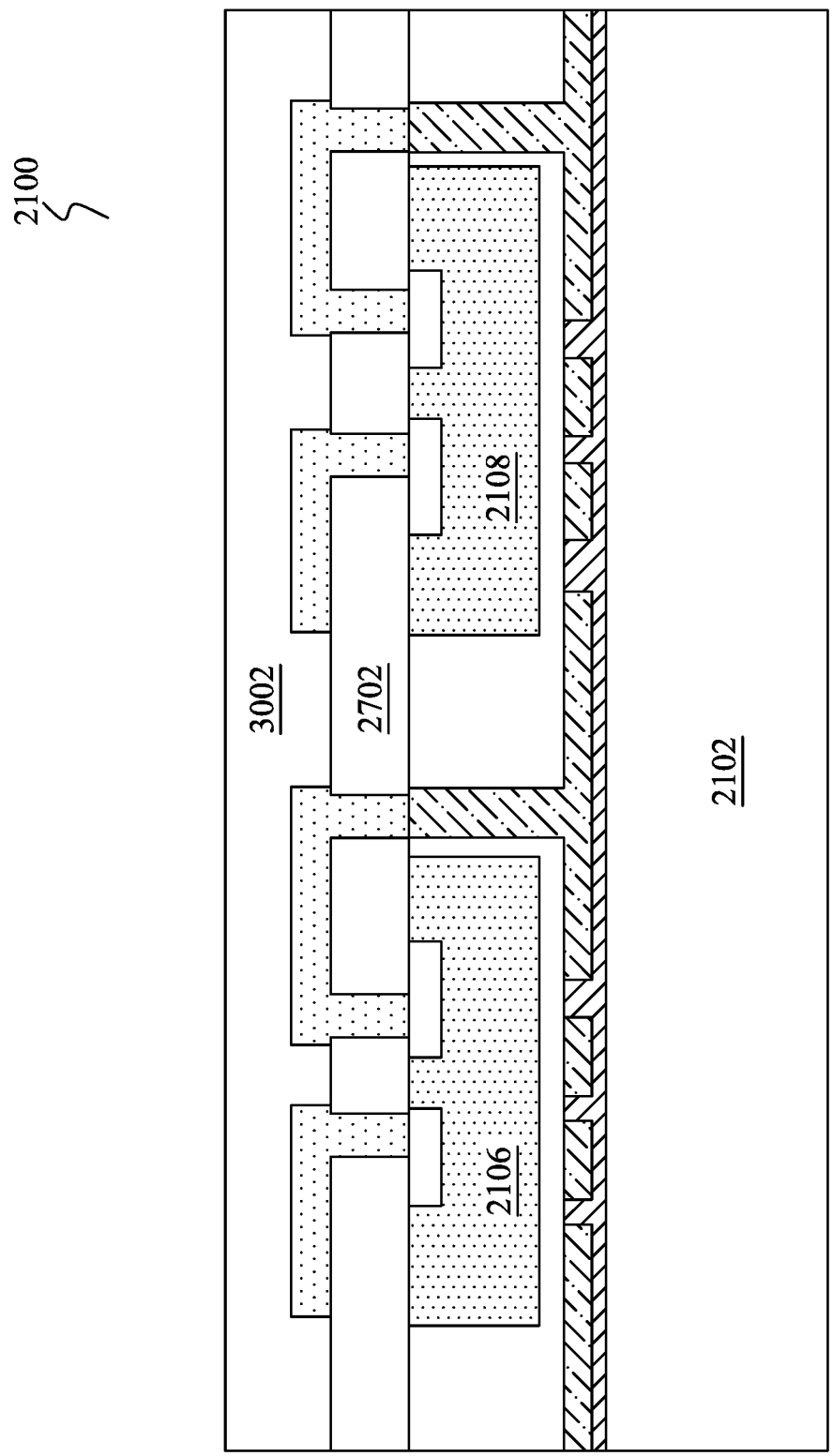
Figure 30:
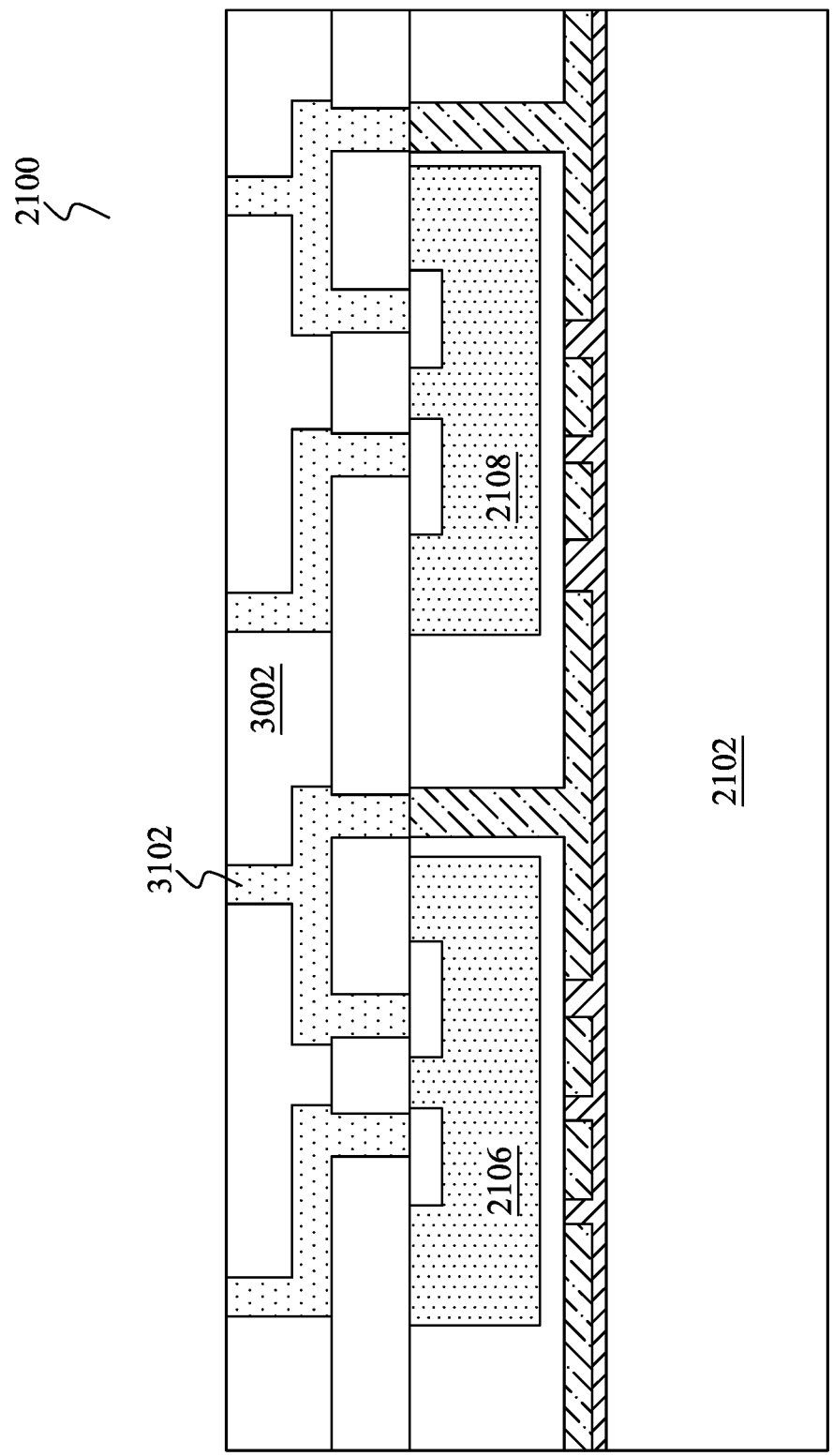
Figure 31:
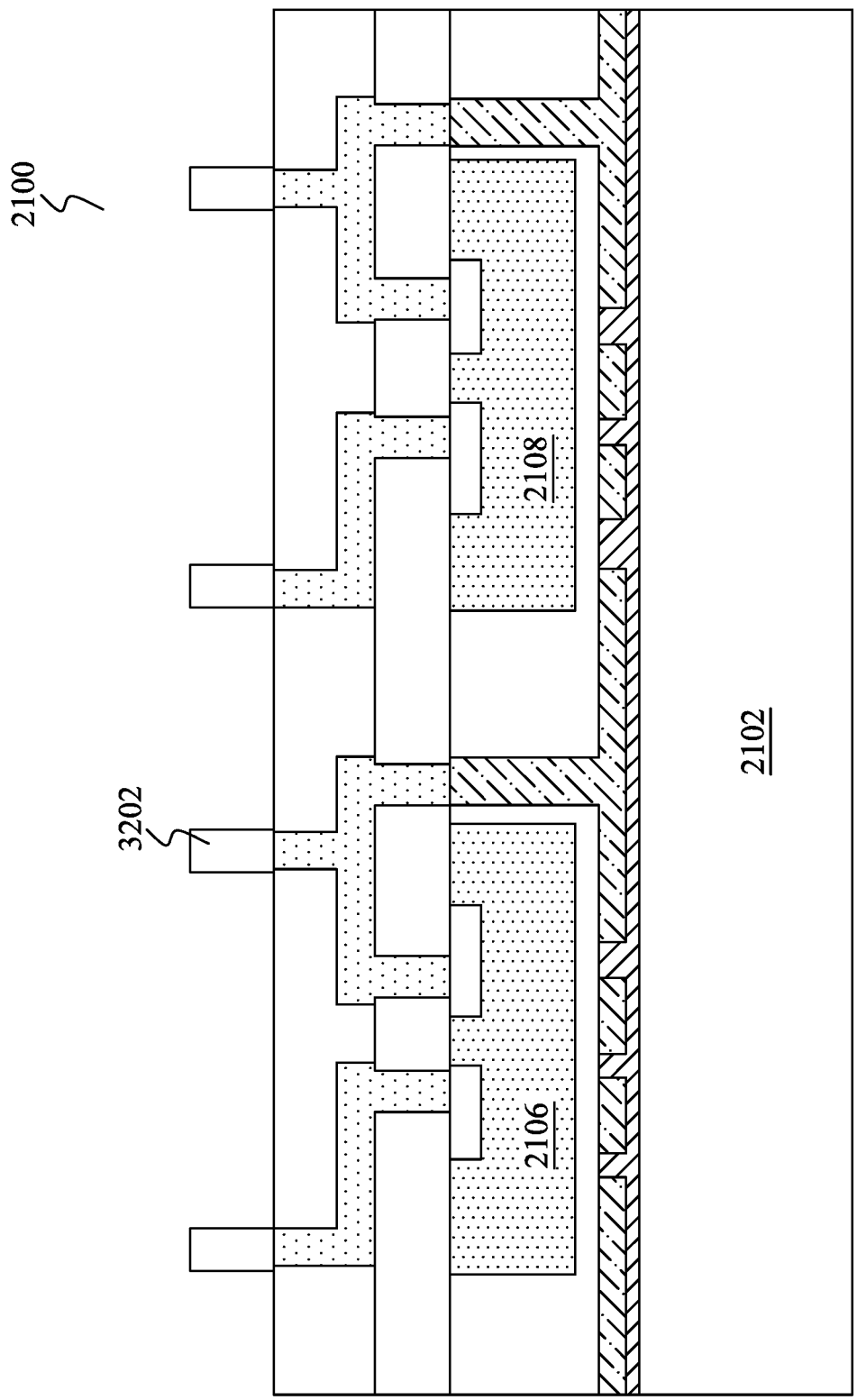
Figure 32:
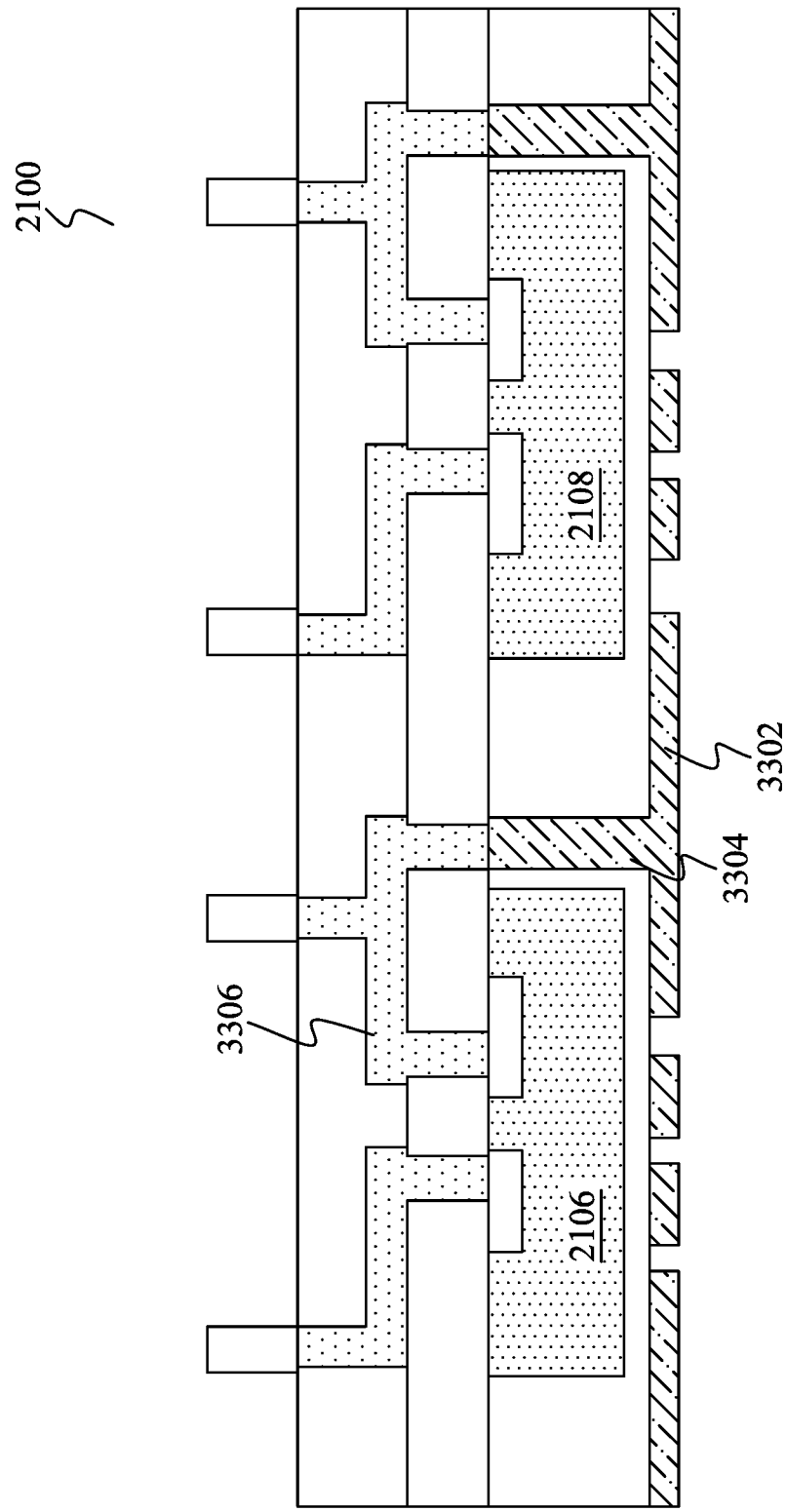
Figure 33:
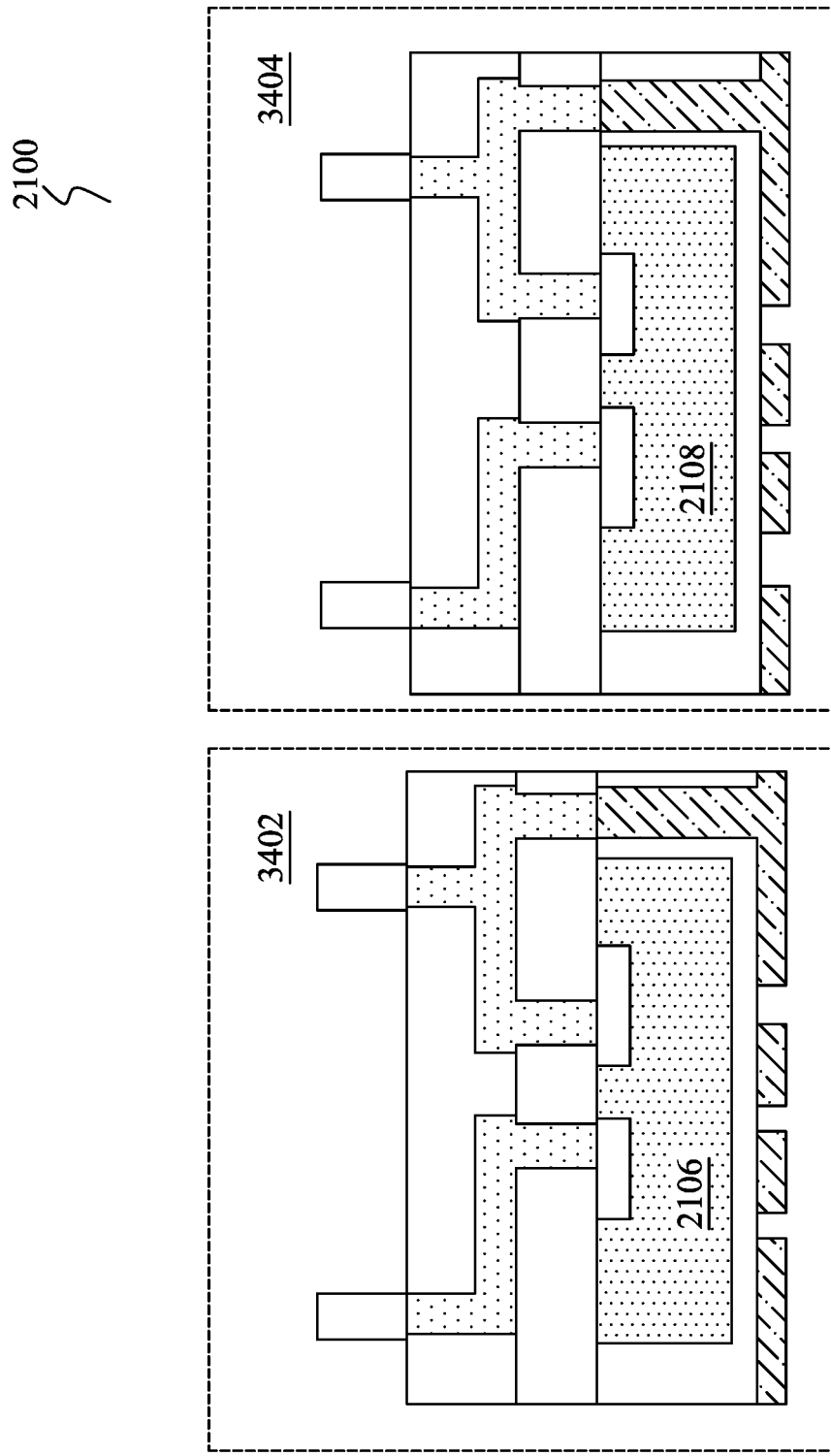

FIG. 19 illustrates a process of removing the carrier from the semiconductor device. In accordance with an embodiment, the carrier 1402 can be detached from the semiconductor device. A variety of detaching processes may be employed to separate the semiconductor device from the carrier 1402. The variety of detaching processes may comprise a chemical solvent, a UV exposure and the like.

In a conventional wireless system, the antenna structure may be formed in/on a printed circuit board (PCB). There may be a long signal transmission path between the antenna structure and its corresponding semiconductor die. One advantageous feature of the antenna structure shown in FIG. 19 is that the signal transmission path from the antenna structure to the semiconductor die is very short in comparison with the conventional antenna structure. As such, the signal losses of a wireless system based upon the antenna structure shown in FIG. 19 can be reduced. Another advantageous feature of the antenna structure shown in FIG. 19 is that the form factor of the wireless system can be improved by integrating the antenna structure into the semiconductor package.

FIGS. 20-33 are cross sectional views of intermediate stages in the making of another semiconductor device having antenna structures in accordance with an embodiment. The fabrication process of the semiconductor device 2100 is similar to that of the semiconductor device 300 shown in FIGS. 3A-19 except that the antenna structures (e.g., antenna structure 2402 in FIG. 23) formed by post passivation interconnects are located at a backside of the semiconductor die (e.g., semiconductor dies 2106 and 2108) rather than a front side of the semiconductor die.

In addition, the antenna structures (e.g., antenna structure 3302 in FIG. 32) are electrically connected to the semiconductor die (e.g., semiconductor die 2106 in FIG. 32) as well as the front side interconnects (e.g., front side interconnect 3306 in FIG. 32) through a via (e.g., through via 3304 in FIG. 32) formed in the molding compound layer.

Figure 34:
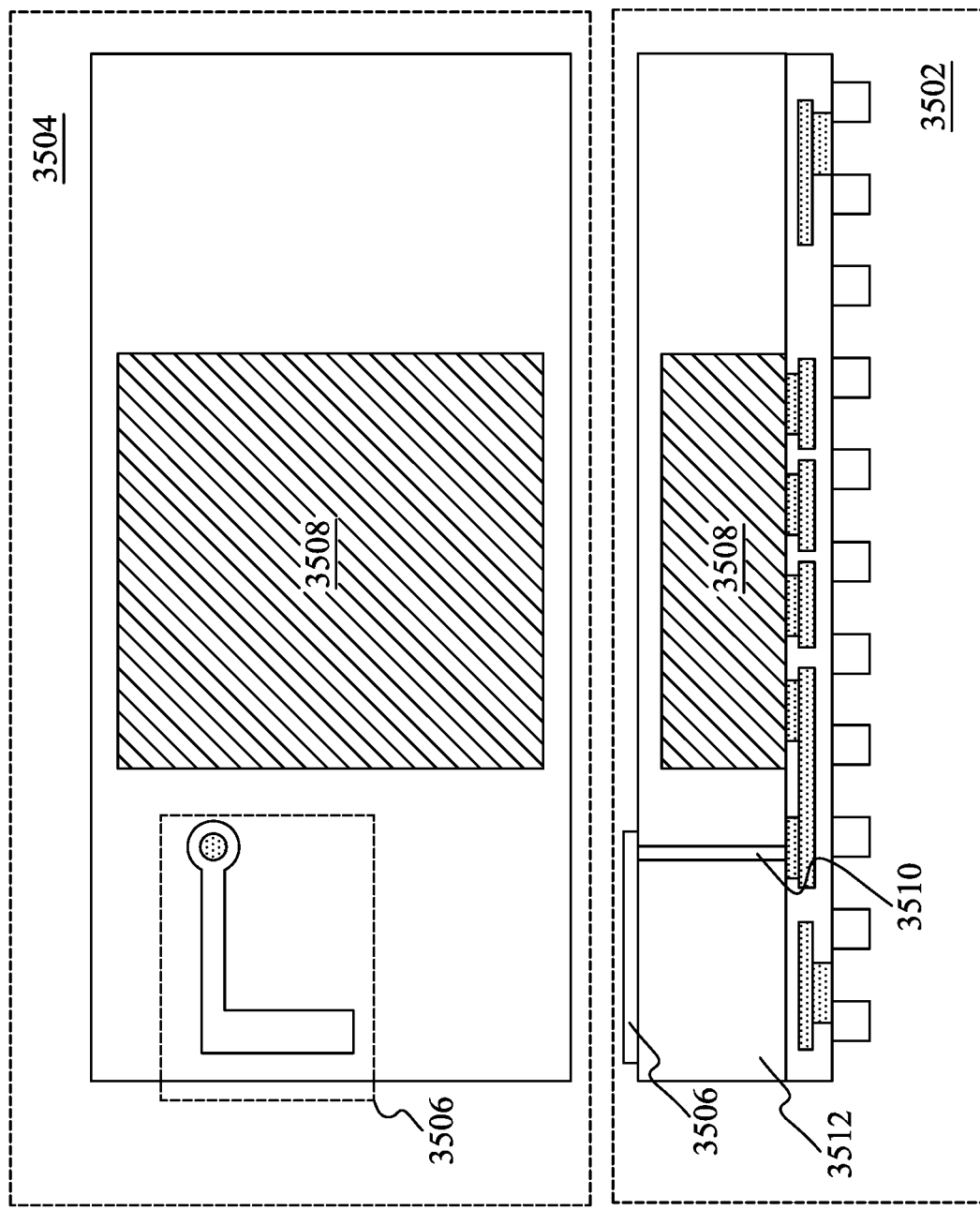
FIG. 34 illustrates a top view and a cross sectional view of a semiconductor device having an antenna structure in accordance with an embodiment.

FIG. 34 illustrates a top view and a cross sectional view of a semiconductor device having an antenna structure in accordance with an embodiment. The cross sectional view 3502 shows an antenna structure 3506 is electrically connected to the semiconductor die 3508 through a conductive channel formed by a through via 3510, a first input output pad, a redistribution layer and a second input and output pad. The through via 3510 is formed in the fan-out region of the semiconductor device. More particularly, the through via 3510 is in the molding compound layer 3512 as shown in FIG. 35.

The top view 3504 shows the shape of the antenna structure 3506 in accordance with an embodiment. The antenna structure 3506 may be of a dipole shape. The antenna structure 3506 is formed over the molding compound layer 3512 and has a terminal electrically connected to the through via 3510 formed in the molding compound layer 3512.

It should be noted that the shape of the antenna structure 3506 is substantially dipole in shape as shown in FIG. 34. It is within the scope and spirit of various embodiments for the antenna structure to comprise other shapes such as oval, square, rectangular, circular, triangular, elliptical and the like.

Figure 35:
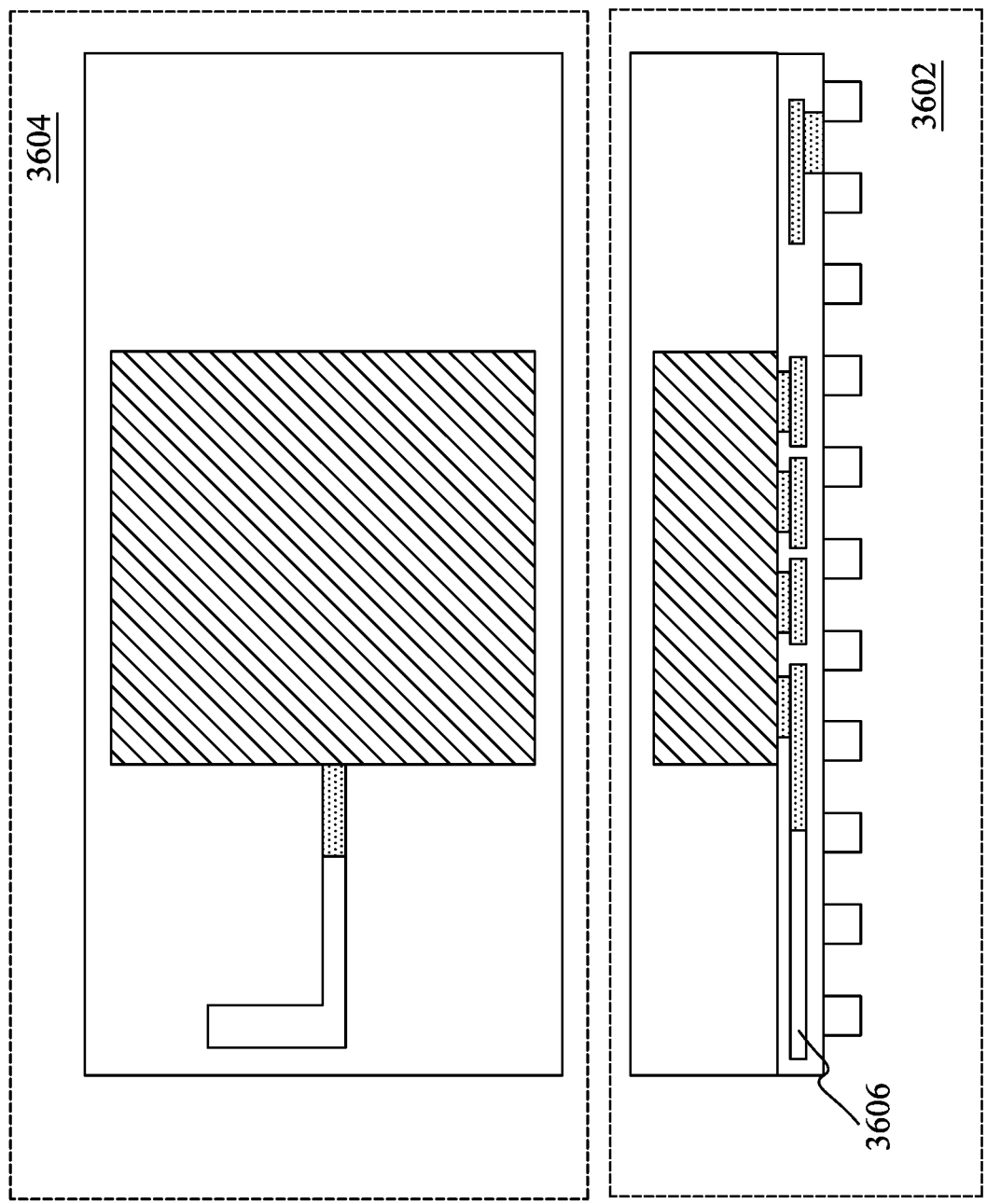
FIG. 35 illustrates a top view and a cross sectional view of a semiconductor device having an antenna structure in accordance with another embodiment.

FIG. 35 illustrates a top view and a cross sectional view of a semiconductor device having an antenna structure in accordance with another embodiment. The antenna structure shown in FIG. 35 is similar to the antenna structure shown in FIG. 34 except that the antenna structure 3606 is formed at the front side of the semiconductor die. The detailed formation process of fabricating an antenna structure at the front side of the semiconductor die has been described above with respect to FIGS. 3A-19, and hence is not discussed herein to avoid repetition.

Figure 36:
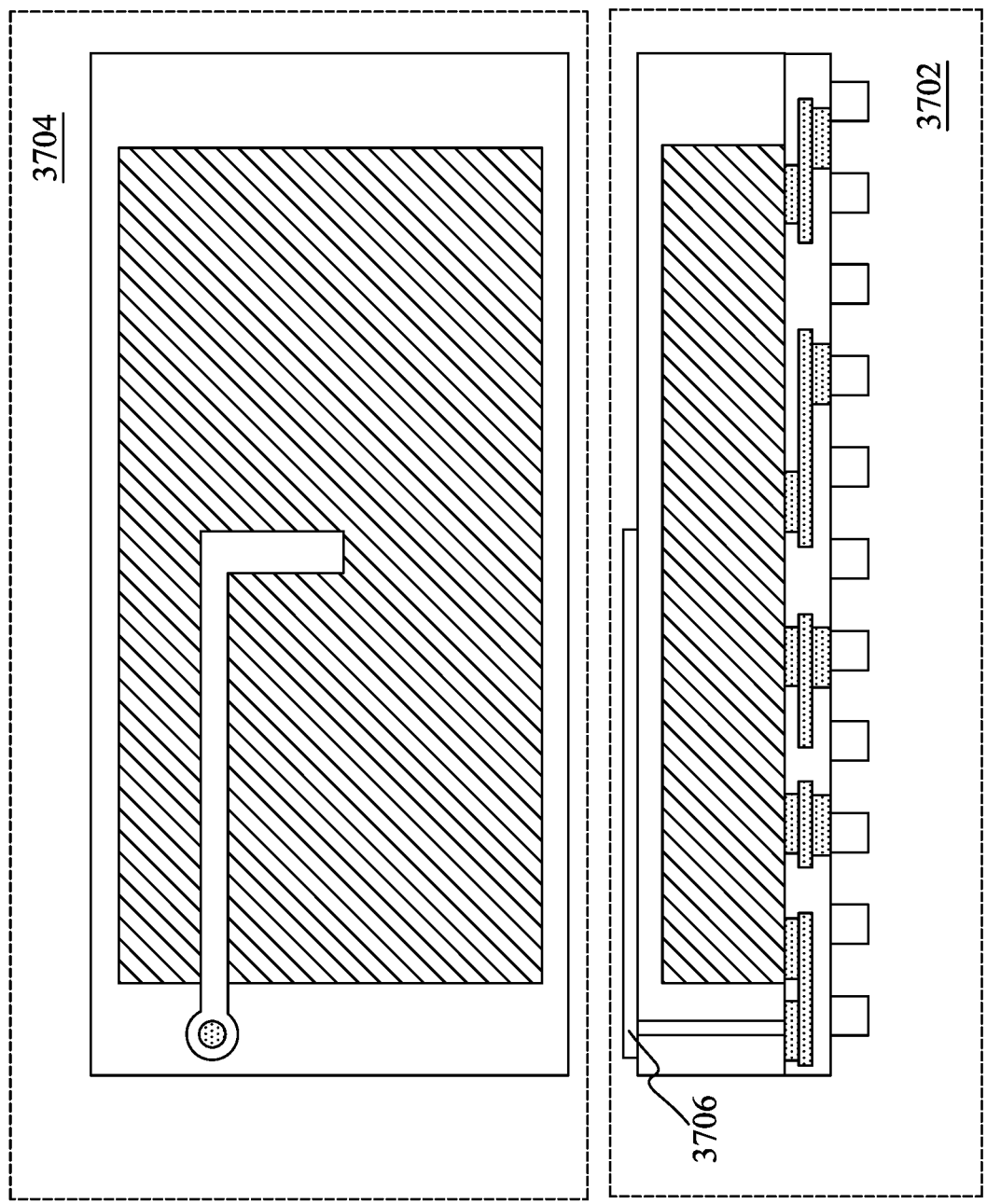
FIG. 36 illustrates a top view and a cross sectional view of a semiconductor device having an antenna structure in accordance with yet another embodiment.

FIG. 36 illustrates a top view and a cross sectional view of a semiconductor device having an antenna structure in accordance with yet another embodiment. The antenna structure shown in FIG. 36 is similar to the antenna structure shown in FIG. 34 except that the antenna structure 3706 is formed above the semiconductor die rather than the fan-out region of the semiconductor device. The detailed formation process of fabricating the antenna structure shown in FIG. 36 is similar to that of the antenna structure shown in FIG. 34, and hence is not discussed herein to avoid repetition.

Figure 37:
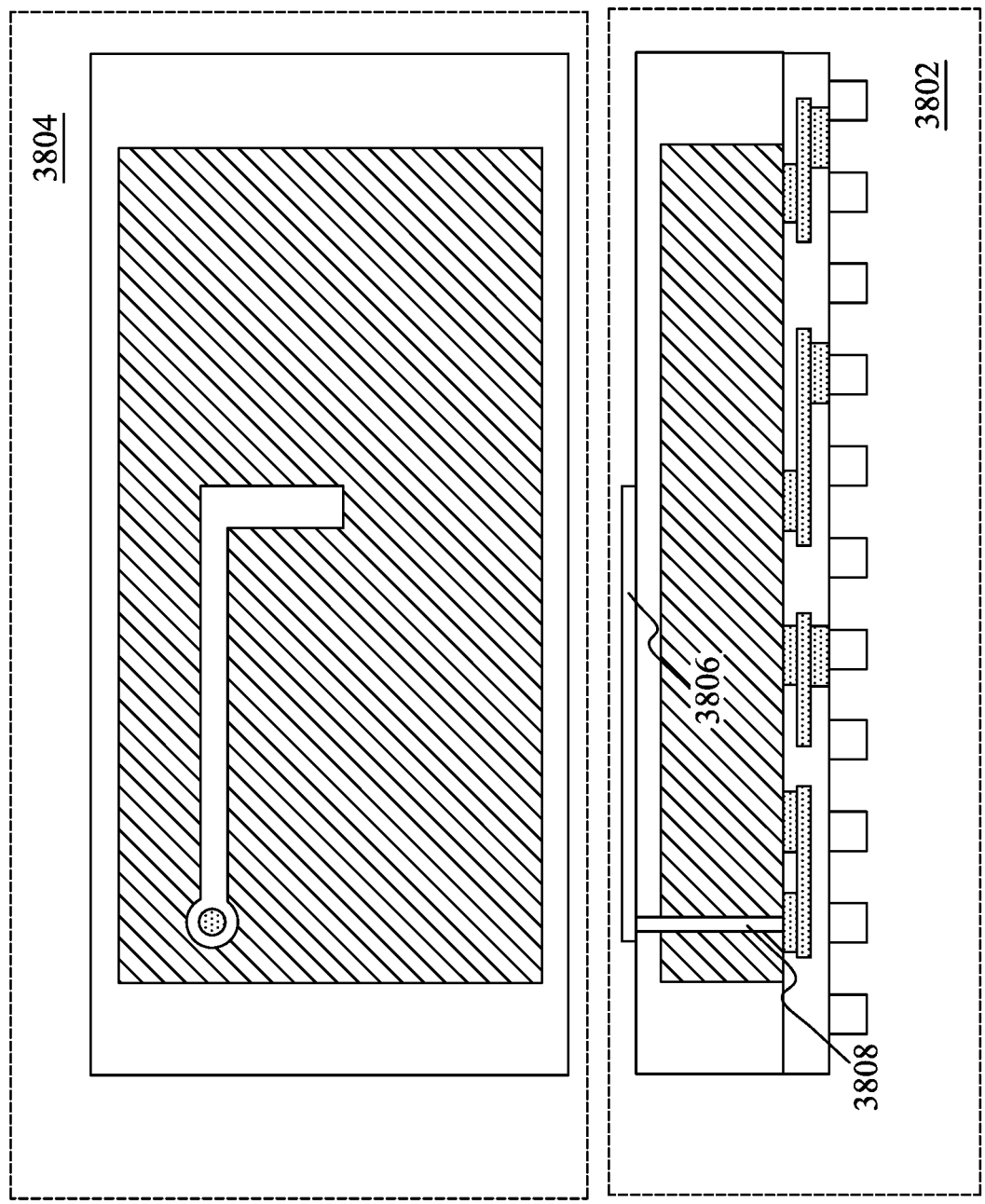
FIG. 37 illustrates a top view and a cross sectional view of a semiconductor device having an antenna structure in accordance with yet another embodiment.

FIG. 37 illustrates a top view and a cross sectional view of a semiconductor device having an antenna structure in accordance with yet another embodiment. The antenna structure shown in FIG. 37 is similar to the antenna structure shown in FIG. 36 except that the through via 3808 electrically connected to the antenna structure 3806 is formed in the semiconductor die rather than the molding compound layer of the semiconductor device.

FIG. 38 illustrates a top view of an antenna structure in accordance with an embodiment. The antenna structure 3902 may be of a meander line shape. As shown in FIG. 38, the meander line portion of the antenna structure 3902 may include three parallel legs. The other terminal of the antenna structure 3902 is connected to a through via 3904. It should be recognized that while FIG. 38 illustrates the antenna structure 3902 with three parallel legs, the antenna structure 3902 could accommodate any number of parallel legs.

Figure 39:
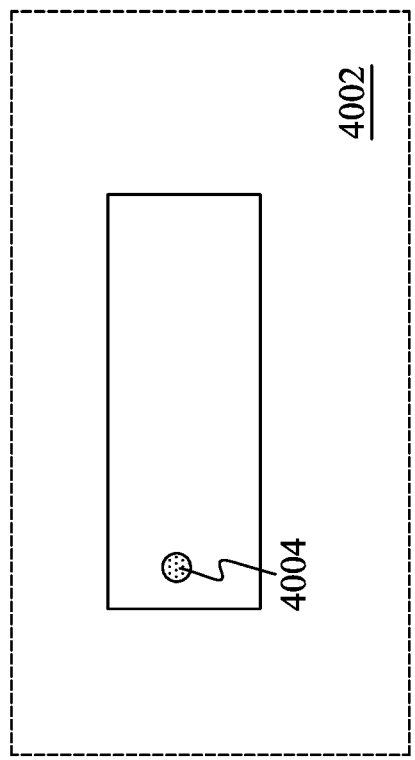
FIG. 39 illustrates a top view of an antenna structure in accordance with another embodiment.

FIG. 39 illustrates a top view of an antenna structure in accordance with another embodiment. The antenna structure may be of a patch shape. As shown in FIG. 39, the antenna structure 4002 is rectangular in shape. One terminal of the antenna structure 4002 is connected to a through via 4004. It should be noted that the shape shown in FIG. 39 is merely an example, which should not unduly limit the scope of the claims. One of ordinary skill in the art would recognize many variations, alternatives, and modifications. For example, the patch can be a slit patch, a slot patch and/or the like.

Figure 40:
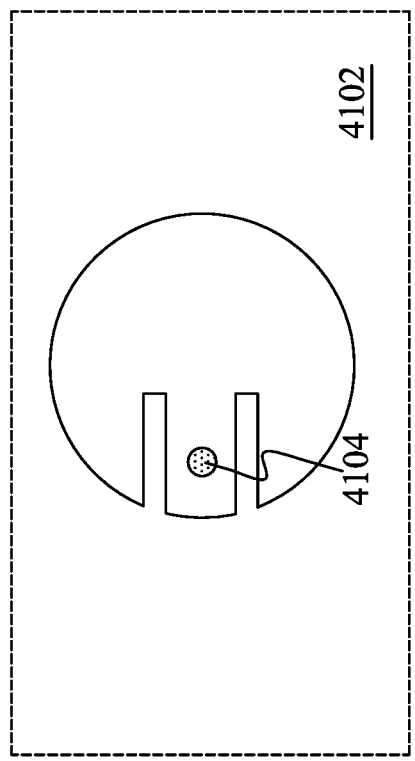
FIG. 40 illustrates a top view of an antenna structure in accordance with yet another embodiment.

FIG. 40 illustrates a top view of an antenna structure in accordance with yet another embodiment. As shown in FIG. 40, the antenna structure 4102 is circular in shape, but with a plurality of slits. One terminal of the antenna structure 4102 is connected to a through via 4104.

Although embodiments and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
a semiconductor die;
a molding compound extending along sidewalls of the semiconductor die;
a through via extending from a first side of the molding compound to a second side of the molding compound;
a first redistribution structure on the first side of the molding compound; and
a second redistribution structure on the second side of the molding compound, wherein the second redistribution structure comprises an antenna structure, wherein a signal transmission path between the semiconductor die and the antenna structure is entirely within the second redistribution structure.

2. The semiconductor device of claim 1, wherein the antenna structure extends only partially over the through via.

3. The semiconductor device of claim 1, wherein the antenna structure extends completely over the through via.

4. The semiconductor device of claim 1, wherein the antenna structure comprises a first metal line and a second metal line, the first metal line extending laterally away from the semiconductor die in a first direction, the second metal line extending laterally away from the semiconductor die in a second direction opposite to the first direction.

5. The semiconductor device of claim 1, wherein the first redistribution structure comprises an external connector.

6. The semiconductor device of claim 1, wherein the second redistribution structure is free of an external connector.

7. The semiconductor device of claim 6, wherein the external connector comprises a solder connection.

8. A semiconductor device comprising:
a semiconductor die having a plurality of conductive contacts;
a molding compound extending along sidewalls of the semiconductor die;
through vias extending from a first side of the molding compound to a second side of the molding compound;
a plurality of first dielectric layers on the first side of the molding compound;
a plurality of first conductive features in the plurality of first dielectric layers, the plurality of first conductive features being electrically interposed between corresponding ones of the through vias and conductive contacts of the semiconductor die; and
an antenna in the plurality of first dielectric layers, wherein the antenna is only directly electrically connected to the semiconductor die.

9. The semiconductor device of claim 8, wherein the antenna comprises a first metal line and a second metal line, the first metal line extending away from a first side of the semiconductor die, the second metal line extending away from a second side of the semiconductor die.

10. The semiconductor device of claim 9, wherein the first side is an opposite side from the second side.

11. The semiconductor device of claim 8, wherein the antenna completely covers at least one through via of the through vias in a plan view.

12. The semiconductor device of claim 8, wherein the antenna only partially overlaps at least one through via of the through vias in a plan view.

13. The semiconductor device of claim 8 further comprising external connectors, wherein the through vias are electrically interposed between the external connectors and the semiconductor die.

14. The semiconductor device of claim 8, wherein at least one of the first plurality of dielectric layers covers the antenna.

15. A semiconductor device comprising:
a semiconductor die;
a molding compound extending along sidewalls of the semiconductor die;
through vias extending through the molding compound;
a plurality of first dielectric layers on a first side of the molding compound;
a plurality of second dielectric layers on a second side of the molding compound, the first side of the molding compound being opposite the second side of the molding compound;
a plurality of first conductive paths in the plurality of first dielectric layers, the plurality of first conductive paths being electrically interposed between corresponding ones of the through vias and the semiconductor die;
an antenna in the first plurality of dielectric layers; and
one or more second conductive paths in the plurality of first dielectric layers, the one or more second conductive paths being electrically interposed between the antenna and the semiconductor die, the one or more second conductive paths being electrically isolated from the through vias by the plurality of first dielectric layers.

16. The semiconductor device of claim 15, wherein the one or more second conductive paths extend higher above the semiconductor die than the plurality of first conductive paths.

17. The semiconductor device of claim 15 further comprising backside interconnects in the plurality of second dielectric layers, wherein the through vias are electrically interposed between the semiconductor die and the backside interconnects.

18. The semiconductor device of claim 15, wherein the one or more second conductive paths extend laterally over the molding compound.

19. The semiconductor device of claim 15, wherein the antenna extends at least partially over the semiconductor die and at least a first through via of the through vias.

20. The semiconductor device of claim 19, wherein the antenna extends completely over at least a second through via of the through vias.

* * * * *